United States Patent
Kim et al.

(10) Patent No.: US 10,014,208 B2
(45) Date of Patent: *Jul. 3, 2018

(54) SEMICONDUCTOR DEVICE HAVING A DEVICE ISOLATION LAYER

(71) Applicant: SAMSUNG ELECTRONICS CO., LTD., Suwon-si, Gyeonggi-Do (KR)

(72) Inventors: Ju-Youn Kim, Suwon-si (KR); Min-Choul Kim, Hwaseong-si (KR); Baik-Min Sung, Seoul (KR); Sang-Hyun Woo, Seongnam-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/444,567

(22) Filed: Feb. 28, 2017

(65) Prior Publication Data

US 2017/0170054 A1 Jun. 15, 2017

Related U.S. Application Data

(63) Continuation of application No. 15/015,937, filed on Feb. 4, 2016, now Pat. No. 9,614,035.

(30) Foreign Application Priority Data

Jun. 24, 2015 (KR) ........................ 10-2015-0089803

(51) Int. Cl.
*H01L 27/088* (2006.01)
*H01L 21/762* (2006.01)
*H01L 27/092* (2006.01)

(52) U.S. Cl.
CPC .... *H01L 21/76224* (2013.01); *H01L 27/0886* (2013.01); *H01L 21/76232* (2013.01); *H01L 27/0924* (2013.01)

(58) Field of Classification Search
CPC ..... H01L 21/823431; H01L 21/823821; H01L 27/0886; H01L 27/0924; H01L 27/10879; H01L 29/41791; H01L 21/76; H01L 21/76283; H01L 27/088; H01L 27/1211; H01L 29/0653; H01L 29/66545; H01L 29/7848

(Continued)

(56) References Cited

U.S. PATENT DOCUMENTS 8,846,491 B1* 9/2014 Pham ................ H01L 21/76224
257/E21.409
2005/0156171 A1* 7/2005 Brask .............. H01L 21/823821
257/72

(Continued)

*Primary Examiner* — Shahed Ahmed
(74) *Attorney, Agent, or Firm* — F. Chau & Associates, LLC

(57) ABSTRACT

A semiconductor device includes a fin protruding from a substrate and extending in a first direction, first and second gate structures intersecting the fin, a recess formed in the fin between the first and second gate structures, a device isolation layer which fills the recess, and which has an upper surface protruded outwardly from the fin and disposed to be coplanar with upper surfaces of the first and second gate structures, a liner formed along a side walls of the device isolation layer protruded outwardly from the fin and a source/drain region disposed at both sides of the recess and spaced apart from the device isolation layer.

19 Claims, 36 Drawing Sheets

(58) Field of Classification Search
USPC ......... 257/288, 368, 369; 438/151, 197, 199
See application file for complete search history.

(56) References Cited

U.S. PATENT DOCUMENTS

| | | |
|---|---|---|
| 2013/0248927 A1 | 9/2013 | Wu et al. |
| 2014/0159158 A1* | 6/2014 | Kim .................... H01L 27/088 257/368 |
| 2016/0380052 A1 | 12/2016 | Kim et al. |

* cited by examiner

1200

1300

1400

SEMICONDUCTOR DEVICE HAVING A DEVICE ISOLATION LAYER

CROSS-REFERENCE TO RELATED APPLICATION

The present application is a continuation of U.S. patent application Ser. No. 15/015,937, filed on Feb. 4, 2016, which claims under 35 U.S.C. 119 priority to and the benefit of Korean Patent Application No. 10-2015-0089803 filed on Jun. 24, 2015 in the Korean Intellectual Property Office, the entire contents of which are incorporated by reference herein.

BACKGROUND

1. Technical Field

The present inventive concept relates to a semiconductor device.

2. Description of the Related Art

As one of scaling techniques for increasing semiconductor device density, a multi-gate transistor has been proposed in which a fin-shaped or nanowire-shaped multi channel active pattern (or silicon body) is formed on a substrate and a gate is formed on a surface of the multi channel active pattern.

Since multi-gate transistors may utilize a three-dimensional channel, scaling can be easily achieved. In addition, the ability to control current may also be improved without necessarily increasing the length of the gate in the multi-gate transistor. Further, short channel effects, in which the potential of the channel region is affected by a drain voltage, can be effectively suppressed.

SUMMARY

An aspect of the present inventive concept provides a semiconductor device with improved device isolation characteristics.

Another aspect of the present inventive concept provides a semiconductor device in which electrical short is prevented and a source/drain is grown normally to achieve improved operating characteristics.

However, aspects of the present inventive concept are not restricted to those set forth herein. The other aspects of the present inventive concept which are not mentioned herein will become more apparent to a person skilled in the art to which the present inventive concept pertains by referencing the detailed description of the present inventive concept given below.

According to an aspect of the present inventive concept, there is provided a semiconductor device having a fin protruded from a substrate and extended in a first direction, first and second gate structures disposed to intersect the fin, a recess formed in the fin between the first and second gate structures, a device isolation layer which fills the recess, and which has an upper surface protruded outwardly from the fin and disposed to be coplanar with upper surfaces of the first and second gate structures, a liner formed along a side walls of the device isolation layer protruded outwardly from the fin and a source/drain region disposed at both sides of the recess and spaced apart from the device isolation layer.

In some example embodiments, the device isolation layer includes a first device isolation layer disposed in the recess and a second device isolation layer disposed in the upper region, wherein a width of the first device isolation layer is narrower than a width of the second device isolation layer.

In some example embodiments, the first device isolation layer and the second device isolation layer are formed of materials different from each other.

In some example embodiments, the semiconductor device further includes a spacer which is formed between the second device isolation layer and the fin, and which contacts a sidewall of the first device isolation layer.

In some example embodiments, the spacer is interposed between the source/drain region and the device isolation layer.

In some example embodiments, a lower surface of the liner contacts an upper surface of the spacer.

In some example embodiments, an upper surface of the spacer and an upper surface of the first device isolation layer are disposed to be coplanar with each other.

In some example embodiments, a lower surface of the recess is lower than a lower surface of the source/drain region.

In some example embodiments, the liner extends upwardly along a sidewall of the device isolation layer and disposed to be coplanar with upper surface of the device isolation layer.

In some example embodiments, the semiconductor device further includes an interlayer insulation layer which covers the fin between the first gate structure and the device isolation layer and between the second gate structure and the device isolation layer, wherein an upper surface of the interlayer insulation layer is disposed to be coplanar with the upper surface of the device isolation layer.

According to another aspect of the present inventive concept, there is provided a semiconductor device having a fin which has a shape protruding from a substrate, and which is extended in a first direction, a recess formed in the fin, a first device isolation layer which fills the recess, a second device isolation layer which is formed on the first device isolation layer, and which has a width different from a width of the first device isolation layer, a source/drain region disposed at both sides of the recess and spaced apart from the device first isolation layer, a spacer interposed between the first device isolation layer and the source/drain region and a liner which covers a sidewall of the second device isolation layer.

In some example embodiments, the first device isolation layer and the second device isolation layer are formed of materials different from each other.

In some example embodiments, an upper surface of the spacer contacts a lower surface of the liner.

In some example embodiments, the spacer and the liner are formed of materials different from each other.

In some example embodiments, an upper surface of the spacer and an upper surface of the first device isolation layer are disposed to be coplanar with each other.

According to another aspect of the present inventive concept, there is provided a semiconductor device having a fin protruded from a substrate and extended in a first direction, first and second gate structures disposed to intersect the fin, a recess formed in the fin between the first and second gate structures, a first device isolation layer which fills the recess, a second device isolation layer which is formed on the first device isolation layer, and which has a width different from a width of the first device isolation layer, and a liner which covers a sidewall of the second device isolation layer, wherein liner extends in coplanar with the upper surface of the first and second gate structures.

In some example embodiments, the first device isolation layer and the second device isolation layer are formed of materials different from each other.

In some example embodiments, the liner extends in coplanar with the upper surface of the second device isolation layer.

In some example embodiments, the semiconductor further includes a source/drain region disposed at both sides of the recess and spaced apart from the device first isolation layer, wherein the recess is disposed adjacent to the substrate than the source/drain region.

In some example embodiments, a width of the first device isolation layer is narrower than a width of the second device isolation layer.

DETAILED DESCRIPTION

Figure 1:
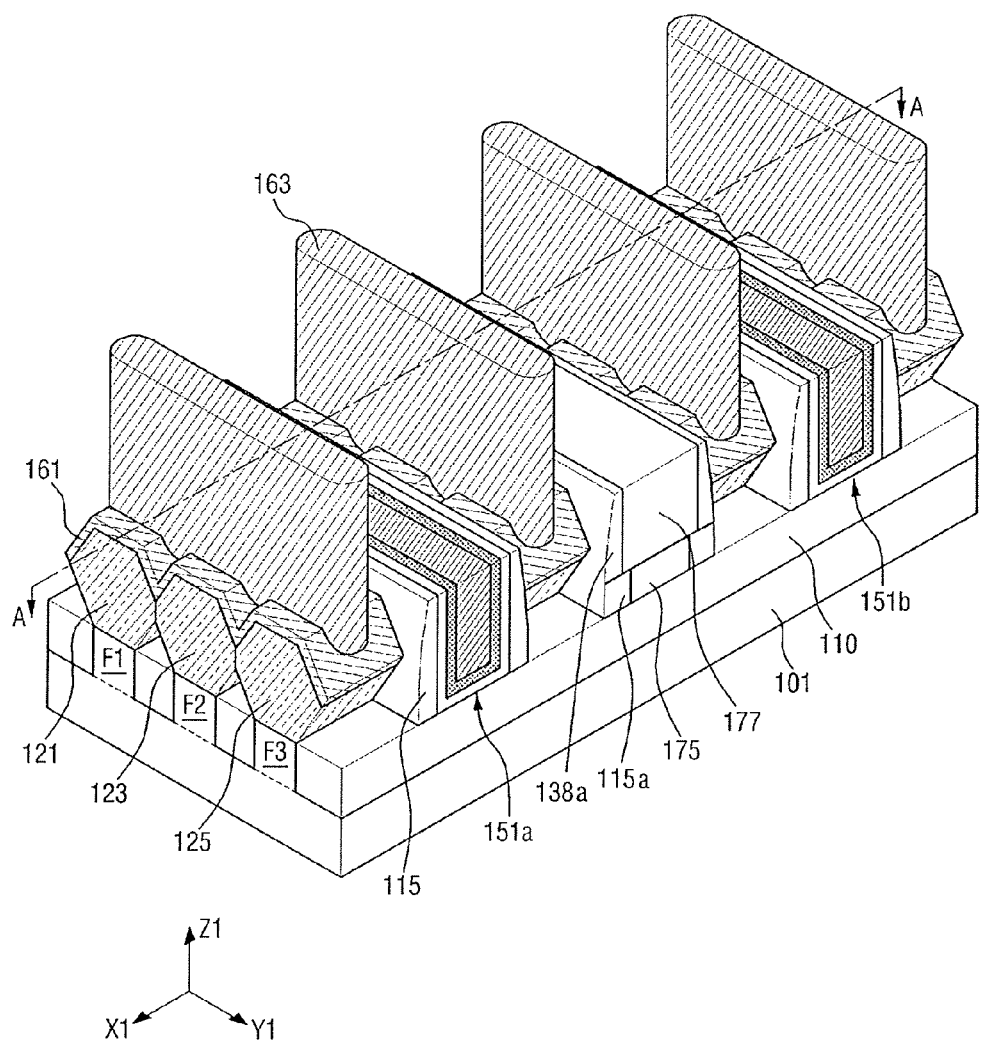
FIG. 1 is a perspective view of a semiconductor device according to some example embodiments of the present inventive concept.

Advantages and features of the present inventive concept and methods of accomplishing the same may be understood more readily by reference to the following detailed description of example embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the concept of the disclosure to those skilled in the art, and the present inventive concept will only be defined by the appended claims. In the drawings, the thickness of layers and regions are exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, and the like, may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

The use of the terms "a" and "an" and "the" and similar referents in the context of describing the inventive concept (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this inventive concept belongs. It is noted that the use of any and all examples, or example terms provided herein is intended merely to better illuminate the inventive concept and is not a limitation on the scope of the inventive concept unless otherwise specified. Further, unless defined otherwise, all terms defined in generally used dictionaries may not be overly interpreted.

A semiconductor device according to some embodiments of the present inventive concept will be explained with reference to FIG. 1 and FIG. 2.

Figure 2:
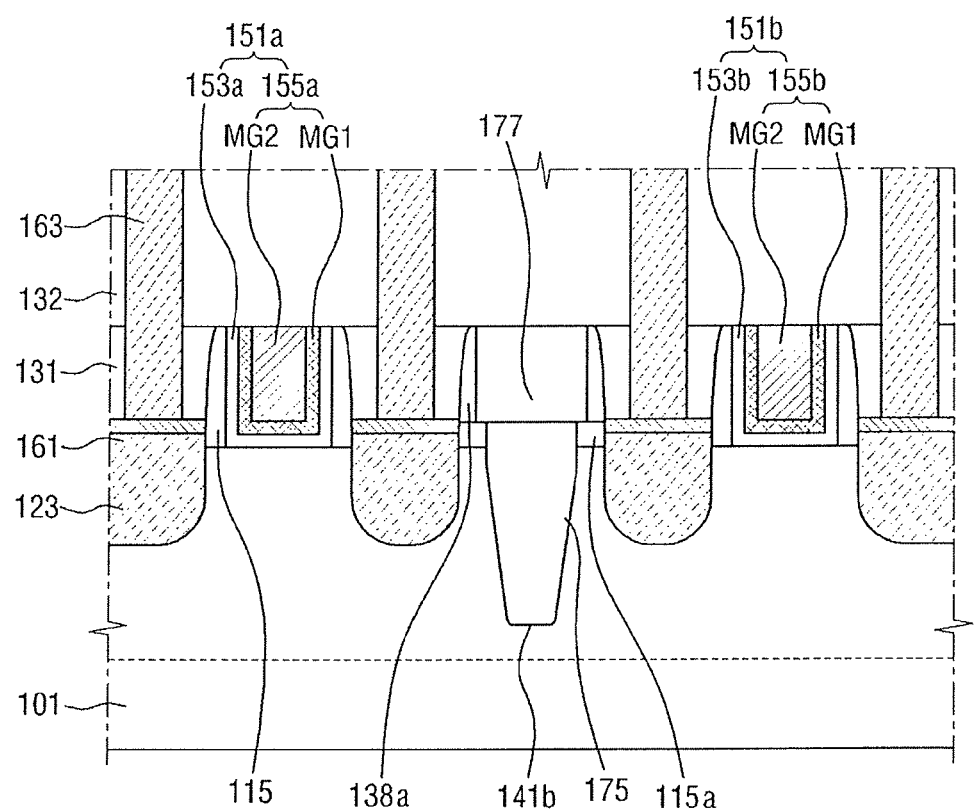
FIG. 2 is a cross-sectional view taken along the line A-A of FIG. 1.

FIG. 1 is a perspective view of a semiconductor device according to some example embodiments of the present inventive concept, and FIG. 2 is a cross-sectional view taken along the line A-A of FIG. 1. First and second interlayer insulation layers 131 and 132 are omitted in FIG. 1.

Referring to FIG. 1 and FIG. 2, the semiconductor device according to some example embodiments of the present inventive concept may include a substrate 101, first, second and third fins F1, F2, F3, a field insulation layer 110, a recess 141b, a first device isolation layer 175, a second device isolation layer 177, first and second gate structures 151a, 151b, a liner 138a, a gate spacer 115, a spacer 115a, first, second and third source/drain regions 121, 123, 125, first and second interlayer insulation layers 131, 132, a silicide layer 161, a contact 163 and the like. The first and second device isolation layers 175, 177 may form a device isolation layer in the present inventive concept.

Specifically, the substrate 101 may be formed of one or more semiconductor materials including Si, Ge, SiGe, GaP, GaAs, SiC, SiGeC, InAs, InP or a combination thereof. Furthermore, a silicon on insulator (SOI) substrate may be used.

The first to third fins F1, F2, F3 may protrude from the substrate 101 in a third direction Z1. Each of the first to third fins F1, F2, F3 may extend along a lengthwise direction, (e.g., a first direction X1). Each of the first to third fins F1, F2, F3 may have a longer side and a shorter side. The first to third fins F1, F2, F3 may be disposed on the substrate 101 such that the first to third fins F1, F2, F3 are spaced apart from each other. For example, the first to third fins F1, F2, F3 may be spaced apart from each other in a second direction Y1. Although the longer side direction is depicted as the first direction X1 and the shorter side direction is depicted as the second direction Y1 in FIG. 1, the present disclosure is not limited thereto. For example, the longer side direction of the first to third fins F1, F2, F3 may be the second direction Y1, and the shorter side direction of the first to third fins F1, F2, F3 may be the first direction X1.

The first to third fins F1, F2, F3 may be a part of the substrate 101, and may include an epitaxial layer grown from the substrate 101. The first to third fins F1, F2, F3 may include, for example, Si, SiGe, or the like. The field insulation layer 110 may be formed on the substrate 101, and may cover a part of a sidewall of the fin F1 and expose an upper part of the fin F1. The field insulation layer 110 may be, for example, an oxide layer.

The first and second gate structures 151a, 151b and the first and second device isolation layers 175, 177 are spaced apart from each other. Each of the first and second gate structures 151a, 151b and first and second device isolation layers 175, 177 may intersect the first to third fins F1, F2, F3. The second device isolation layer 177 may be disposed on the first device isolation layer 175. As described above, the first and second device isolation layers 175, 177 may form a device isolation layer. Thus, an upper region of the device isolation layer may be the second device isolation layer 177, and a lower region of the device isolation layer may be the first device isolation layer 175.

Although the first and second gate structures 151a, 151b, the first and second device isolation layers 175, 177 are depicted as being extended in the second direction Y1 in FIG. 1, the present disclosure is not limited thereto, and the first and second gate structures 151a, 151b and the first and second device isolation layers 175, 177 may intersect the first to third fins F1, F2, F3 while forming an acute angle or an obtuse angle with the first to third fins F1, F2, F3.

The recess 141b aligned in the second direction Y1 is formed in each of the first to third fins F1, F2, F3. The recess 141b is formed inside the first to third fins F1, F2, F3. The recess 141b has a lower surface lower than or at the same height with lower surfaces of the first, second and third source/drain regions 121, 123, 125. Although the recess 141b is depicted in FIG. 2 as having a trench shape of which width becomes narrower in the direction from the top to the bottom thereof, the present disclosure is not limited thereto, and the recess 141b may be in a shape of, for example, U, V, rectangle, trapezoid, and the like.

The first device isolation layer 175 may fill the recess 141b. The first device isolation layer 175 may be formed on the field insulation layer 110, and formed inside the first to third fins F1, F2, F3. Since the first device isolation layer 175 may fill the recess 141b, the lower surface of the first device isolation layer 175 may be lower than the lower surfaces of the first, second and third source/drain regions 121, 123, 125. The first device isolation layer 175 may separate the source/drain region 123 formed at both sides of the first device isolation layer 175, thereby preventing electrical short and current from flowing. The first device isolation layer 175 may be, for example, an oxide layer, a nitride layer, or an oxynitride layer, but the present disclosure is not limited thereto. The first device isolation layer 175 may be spaced apart from the first, second and third source/drain regions 121, 123, 125.

The second device isolation layer 177 may be formed on the first device isolation layer 175. The width of the lower surface of the second device isolation layer 177 may be wider than the width of the upper surface of the first device isolation layer 175. The second device isolation layer 177 and the first device isolation layer 175 may be formed of materials different from each other, but the present disclosure is not limited thereto. The second device isolation layer 177 may be, for example, tonensilazene (TOSZ), or the like, but the present disclosure is not limited thereto.

Upper surfaces of the first and second gate structures 151a, 151b and the upper surface of the second device isolation layer 177 may be disposed to be coplanar with each other.

Each of the first and second gate structures 151a, 151b may include first and second gate insulation layers 153a, 153b and first and second gate electrodes 155a, 155b.

Figure 4:
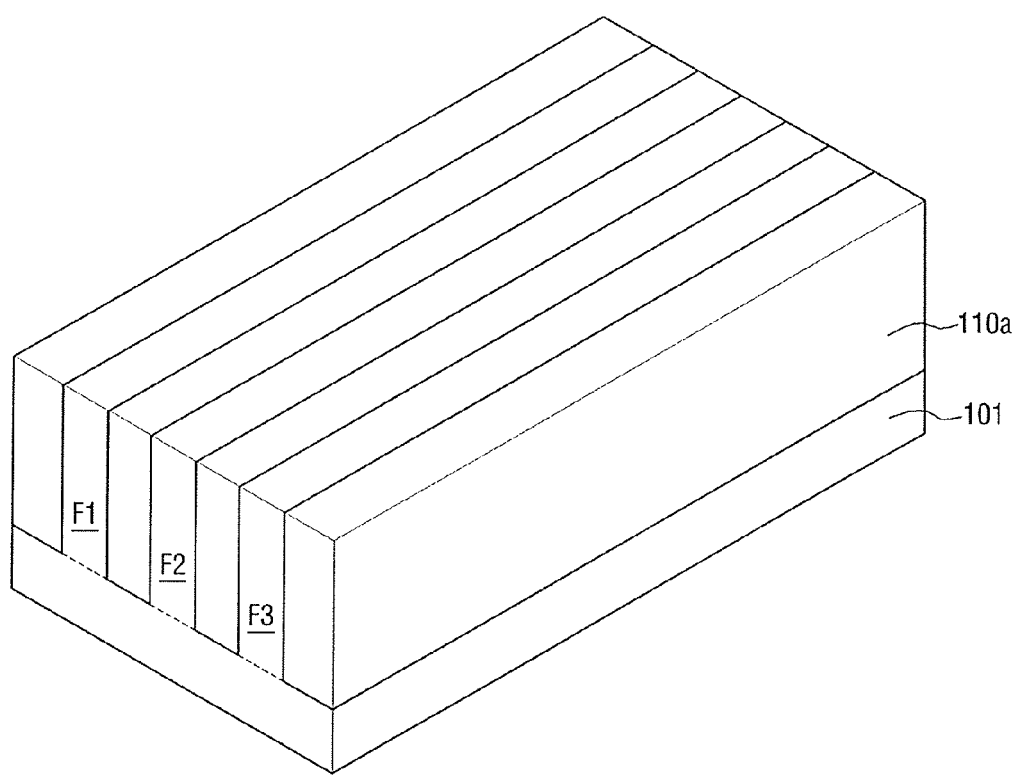

Each of the first and second gate insulation layers 153a, 153b may be formed between the first to third fins F1, F2, F3 and the first and second gate electrodes 155a, 155b. As shown in FIG. 4, each of the first and second gate insulation layers 153a, 153b may be formed on the upper surfaces of the first to third fins F1, F2, F3 and upper surfaces of sidewalls of the first to third fins F1, F2, F3. In addition, each of the first and second gate insulation layers 153a, 153b may be interposed between the first and second gate electrodes 155a, 155b and the field insulation layer 110. The first and second gate insulation layers 153a, 153b may include a high dielectric constant material having a dielectric constant greater than that of a silicon oxide layer. For example, the first and second gate insulation layers 153a, 153b may include $HfO_2$, $ZrO_2$, LaO, Al2O3, $Ta_2O_5$, or the like.

Figure 3:
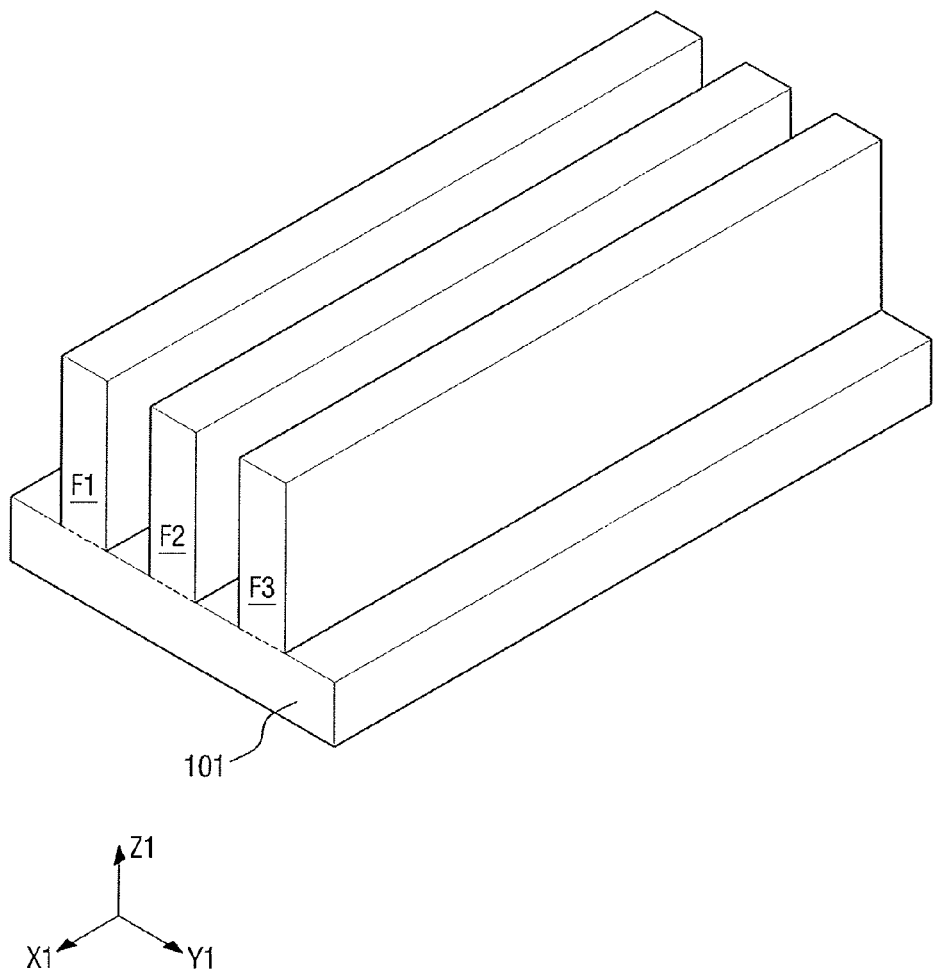
FIGS. 3, 4, 5, 6, 7, 8, 9, 10, 11, 12, 13, 14, 15, 16, 17, 18, 19, 20 and 21 are diagrams illustrating intermediate process steps of a method of fabricating the semiconductor device according to example embodiments of the present inventive concept.

Each of the first and second gate electrodes 155a, 155b may include first and second metal layers MG1, MG2. As shown, each of the first and second gate electrodes 155a, 155b may be formed by stacking two or more layers of the first and second metal layers MG1, MG2. The first metal layer MG1 serves to adjust a work function, and the second metal layer MG2 serves to fill the space formed by the first metal layer MG1. As shown in FIG. 3, the first metal layer MG1 may be conformally formed along the upper surface of the field insulation layer 110, the upper surfaces of the first to third fins F1, F2, F3 and the upper surfaces of the sidewalls of the first to third fins F1, F2, F3. For example, the first metal layer MG1 may include at least one of TiN, TaN, TiC, TiAlC and TaC. The second metal layer MG2 may include W or Al. Alternatively, the first and second gate electrodes 155a, 155b may be formed of a non-metal material, for example, Si, SiGe and the like. The first and second gate structures 151a, 151b described above may be formed through, for example, a replacement process, but the present disclosure is not limited thereto.

The first and second gate structures 151a, 151b may be simultaneously formed, and the detailed description thereof will be given herein below.

The gate spacer 115 may be formed on sidewalls of the first, second gate structures 151a, 151b. The gate spacer 115 may be disposed on the first to third fins F1, F2, F3, but may not be disposed on the recess 143. The gate spacer 115 may include at least one of, for example, an oxide layer, a nitride layer and an oxynitride layer, and may not be formed of a single layer, that is, the gate spacer 115 may be formed by stacking a plurality of layers differently from those shown in the drawings.

The liner 138a may be formed on the sidewall of the second device isolation layer 177. The spacer 115a may be formed on an upper part of the sidewall of the first device isolation layer 175. The liner 138a may be formed on the spacer 115a. That is, the upper surface of the spacer 115a and the lower surface of the liner 138a may contact with each other. The spacer 115a may include at least one of, for example, an oxide layer, a nitride layer and an oxynitride layer, and the liner 138a may include an oxide layer, but the present disclosure is not limited thereto.

The first, second and third source/drain regions 121, 123, 125 may be disposed on both sides of the first and second gate structures 151a, 151b and the first and second device isolation layers 175, 177. That is, the first, second and third source/drain regions 121, 123, 125 may be interposed between the first gate structure 151a and the first and second device isolation layers 175, 177, and between the second gate structure 151b and the first and second device isolation layers 175, 177. The first, second and third source/drain regions 121, 123, 125 may be disposed inside the first to third fins F1, F2, F3. The first to third fins F1, F2, F3 may be partially etched, and the first, second and third source/drain regions 121, 123, 125 may be formed in the etched parts.

Although the first, second and third source/drain regions 121, 123, 125 are depicted as being in contact with each other in FIG. 1, the present disclosure is not limited thereto, and the first, second and third source/drain regions 121, 123, 125 may be spaced apart from each other.

The first, second and third source/drain regions 121, 123, 125 may be elevated source/drain regions. Thus, the upper surfaces of the first, second and third source/drain regions 121, 123, 125 may be higher than the upper surfaces of the first to third fins F1, F2, F3.

When the semiconductor device according to one embodiment of the present inventive concept is a PMOS transistor, the first, second and third source/drain regions 121, 123, 125 may include a compressive stress material. For example, the compressive stress material may have a lattice constant greater than that of Si, and may be, for example, SiGe. The compressive stress material may apply compressive stress to the first to third fins F1, F2, F3 beneath the first and second gate structures 151a, 151b, that is, to a channel region, thereby improving carrier mobility in the channel region.

When the semiconductor device according to one embodiment of the present inventive concept is an NMOS transistor, the first, second and third source/drain regions 121, 123, 125 may include a material same as that of the substrate 101, or a tensile stress material. For example, when the substrate 101 is formed of Si, the first, second and third source/drain regions 121, 123, 125 may be formed of Si or a material having a lattice constant smaller than that of Si (for example, SiC and SiP).

The first, second and third source/drain regions 121, 123, 125 may be formed through an epitaxial growth process.

The silicide layer 161 may be disposed on the first, second and third source/drain regions 121, 123, 125. The silicide layer 161 may be formed along the upper surfaces of the first, second and third source/drain regions 121, 123, 125. The silicide layer 161 may serve to reduce sheet resistance, contact resistance and the like when the first, second and third source/drain regions 121, 123, 125 are in contact with the contact 163, and may include a conductive material, for example, Pt, Ni, Co and the like.

The contact 163 may be formed on the silicide layer 161. The contact 163 may be formed of a conductive material, and may include, for example, W, Al, Cu and the like, but the present disclosure is not limited thereto.

The first interlayer insulation layer 131 and the second interlayer insulation layer 132 are sequentially formed on the field insulation layer 110. The first interlayer insulation layer 131 may cover the silicide layer 161, a sidewall of the gate spacer 115 and a part of a sidewall of the contact 163. The second interlayer insulation layer 132 may cover the rest of the sidewall of the contact 163.

As shown in FIG. 2, the upper surface of the first interlayer insulation layer 131 may be disposed to be coplanar with the upper surfaces of the first and second gate structures 151a, 151b and the upper surfaces of the first and second device isolation layers 175, 177. The upper surface of the first interlayer insulation layer 131, the upper surfaces of the first and second gate structures 151a, 151b, and the upper surfaces of the first and second device isolation layers 175, 177 may be coplanar with each other through a planarization process (for example, a CMP process). The second interlayer insulation layer 132 may be formed to cover the first and second gate structures 151a, 151b and the first and second device isolation layers 175, 177. The first interlayer insulation layer 131 and the second interlayer insulation layer 132 may include at least one of an oxide layer, a nitride layer and an oxynitride layer.

Each of the spacer 115a, the liner 138a and the first and second interlayer insulation layers 131, 132 may include same material or materials different from each other.

A method of fabricating the semiconductor device according to one embodiment of the present inventive concept will be explained with reference to FIG. 3 to FIG. 21.

Figure 5:
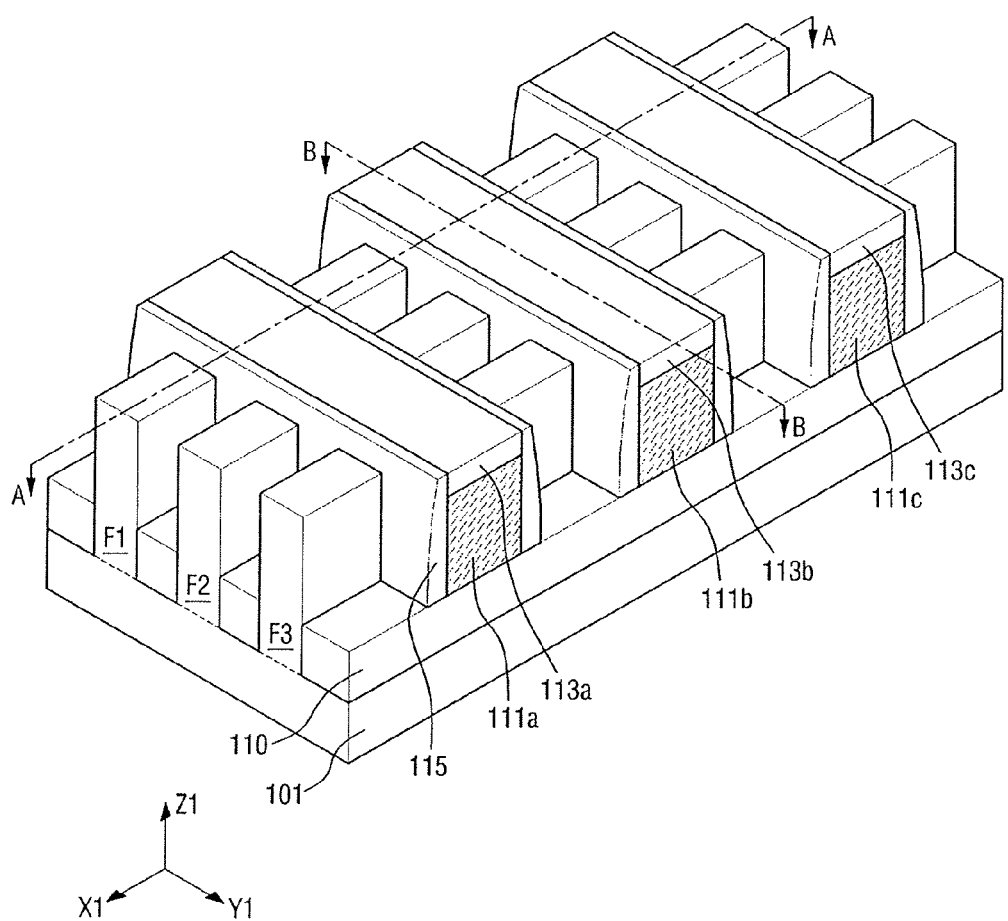

FIG. 3 to FIG. 21 are diagrams illustrating intermediate process steps of a method of fabricating the semiconductor device according to some embodiments of the present inventive concept. Specifically, FIGS. 3, 4, 5, 8, 9 and 11 are perspective views, FIGS. 6, 10, and 12 to 21 are cross-sectional views taken along the lines A-A of FIGS. 5 and 9, and FIG. 7 is a cross-sectional view taken along the line B-B of FIG. 6.

Referring to FIG. 3, the first to third fins F1, F2, F3 may be formed on the substrate 101. The first to third fins F1, F2, F3 may be formed on the substrate 101, and protrude in the third direction Z1. The first to third fins F1, F2, F3 may extend long in the first direction X1, i.e., the lengthwise direction, and may have a longer side in the first direction X1 and a shorter side in the second direction Y1. However, the present disclosure is not limited thereto, and the longer side direction may be the second direction Y1 and the shorter side direction may be the first direction X1 for example. The first to third fins F1, F2, F3 may be spaced apart from each other.

The first to third fins F1, F2, F3 may be a part of the substrate 101, and may include an epitaxial layer grown from the substrate 101. For example, the first to third fins F1, F2, F3 may include Si, SiGe, or the like.

Referring to FIG. 4, an insulation layer 110a is formed to cover sidewalls of the first to third fins F1, F2, F3. The field insulation layer 110 may be formed of a material including at least one of a silicon oxide layer, a silicon nitride layer, and a silicon oxynitride layer.

Figure 6:
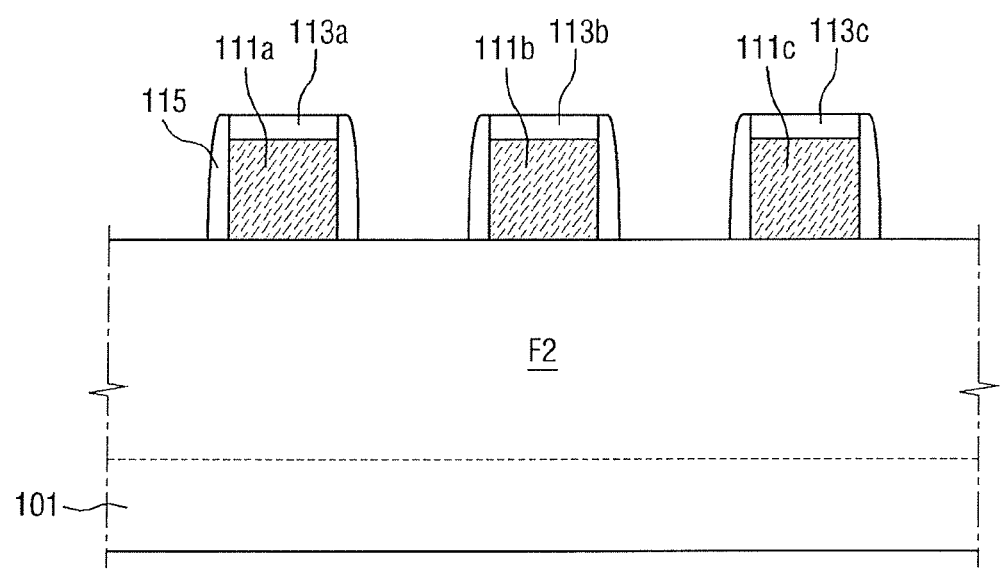
Figure 7:
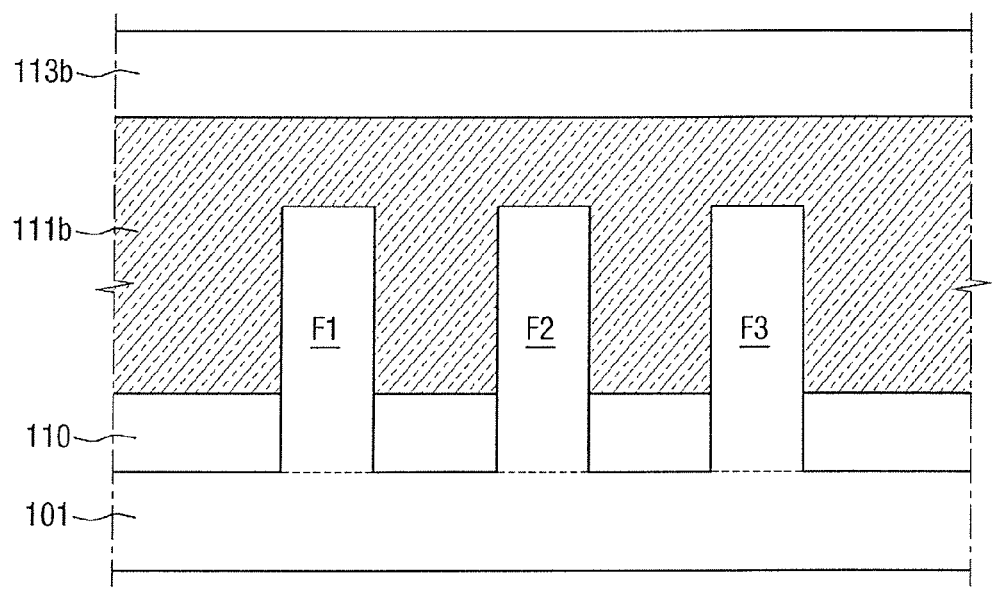

Referring to FIG. 5 to FIG. 7, an upper part of the insulation layer 110a is recessed to form the field insulation layer 110 and expose upper parts of the first to third fins F1, F2, F3. The recess process may include a selective etching process.

The parts of the first to third fins F1, F2, F3 protruded further upward than the field insulation layer 110 may be formed by an epitaxial process. For example, after formation of the insulation layer 110a, the parts of the first to third fins F1, F2, F3 may be formed by an epitaxial process in which upper surfaces of the first to third fins F1, F2, F3 exposed by the insulation layer 110a are used as a seed, without a recess process.

Furthermore, doping for adjusting threshold voltage may be performed on the exposed first to third fins F1, F2, F3. For example, when an NMOS transistor is formed, an impurity may be boron (B), and when a PMOS transistor is formed, an impurity may be phosphorus (P) or arsenic (As).

Figure 28:
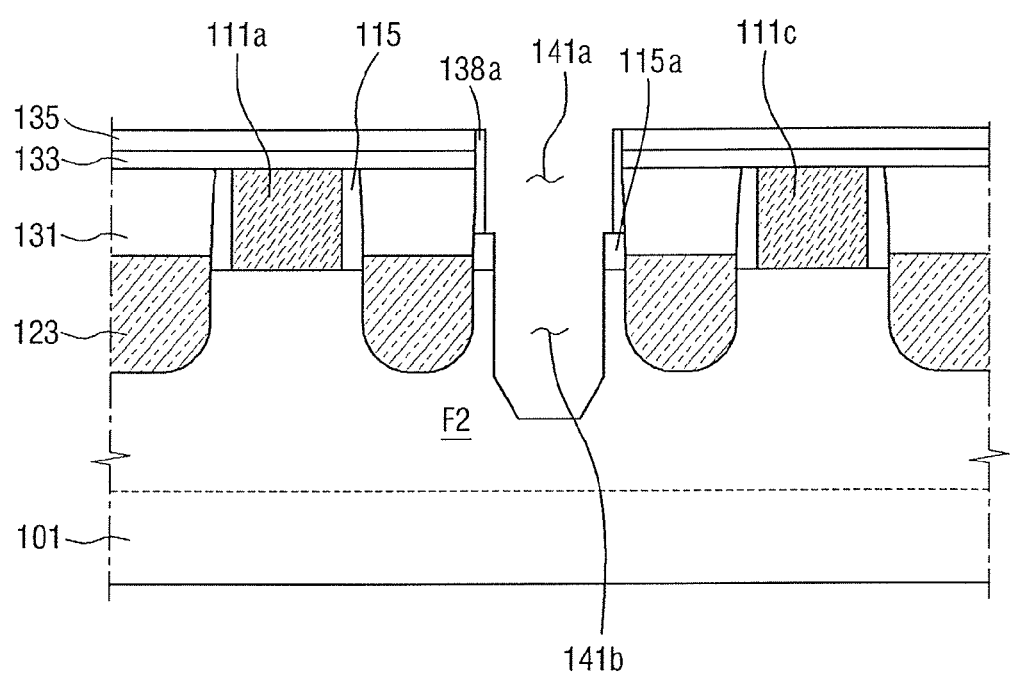

Subsequently, first to third sacrificial gate structures 111a, 111b, 111c are formed on the first to third fins F1, F2, F3 such that the first to third sacrificial gate structures 111a, 111b, 111c intersect the first to third fins F1, F2, F3. The first to third sacrificial gate structures 111a, 111b, 111c may be spaced apart from each other. Although the first to third sacrificial gate structures 111a, 111b, 111c are depicted in FIG. 28 as intersecting the first to third fins F1, F2, F3 in a perpendicular direction, that is, the first direction X1, the present disclosure is not limited thereto, and the first to third sacrificial gate structures 111a, 111b, 111c may intersect the first to third fins F1, F2, F3 while forming an acute angle and/or an obtuse angle with the first direction X1.

The first to third sacrificial gate structures 111a, 111b, 111c may be formed on the upper surfaces and on sidewalls of the first to third fins F1, F2, F3. Furthermore, the first to third sacrificial gate structures 111a, 111b, 111c may be disposed on the field insulation layer 110. The first to third sacrificial gate structures 111a, 111b, 111c may be, for example, a silicon oxide layer.

First to third hard mask layers 113a, 113b, 113c may be formed on the respective first to third sacrificial gate structures 111a, 111b, 111c. The first to third hard mask layers 113a, 113b, 113c may be formed of a material including at least one of a silicon oxide layer, a silicon nitride layer, and a silicon oxynitride layer.

Subsequently, the gate spacer 115 is formed on both sidewalls of the first to third sacrificial gate structures 111a, 111b, 111c. The gate spacer 115 may expose upper surfaces of the first to third hard mask layers 113a, 113b, 113c. The gate spacer 115 may be a silicon nitride layer or a silicon oxynitride layer.

Figure 8:
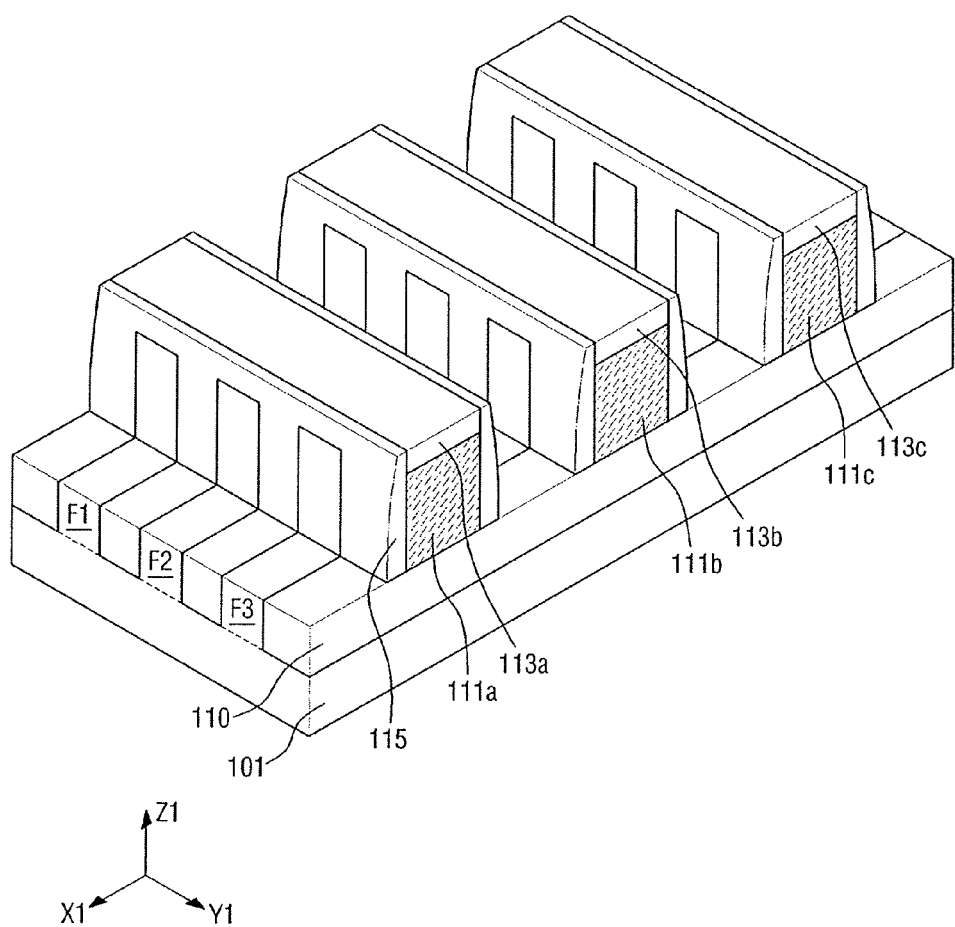
Figure 9:
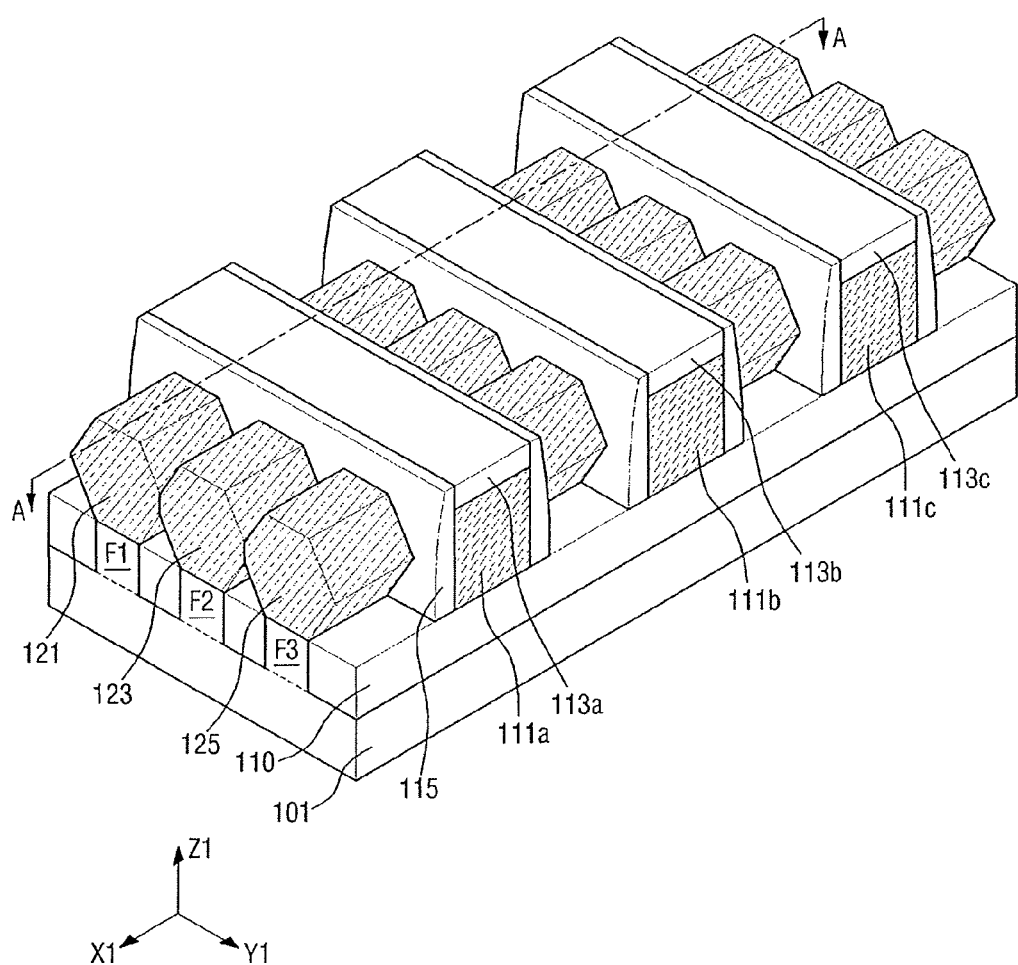

Referring to FIG. 8, the first to third fins F1, F2, F3 are etched. The first to third fins F1, F2, F3 are etched excluding the parts thereof covered by the first to third sacrificial gate structures 111a, 111b, 111c. Thus, the parts of the first to third fins F1, F2, F3 exposed among the first to third sacrificial gate structures 111a, 111b, 111c may be etched. The first to third fins F1, F2, F3 may be etched using the gate spacer 115 and the first to third hard mask layers 113a, 113b, 113c as etching masks.

Figure 10:
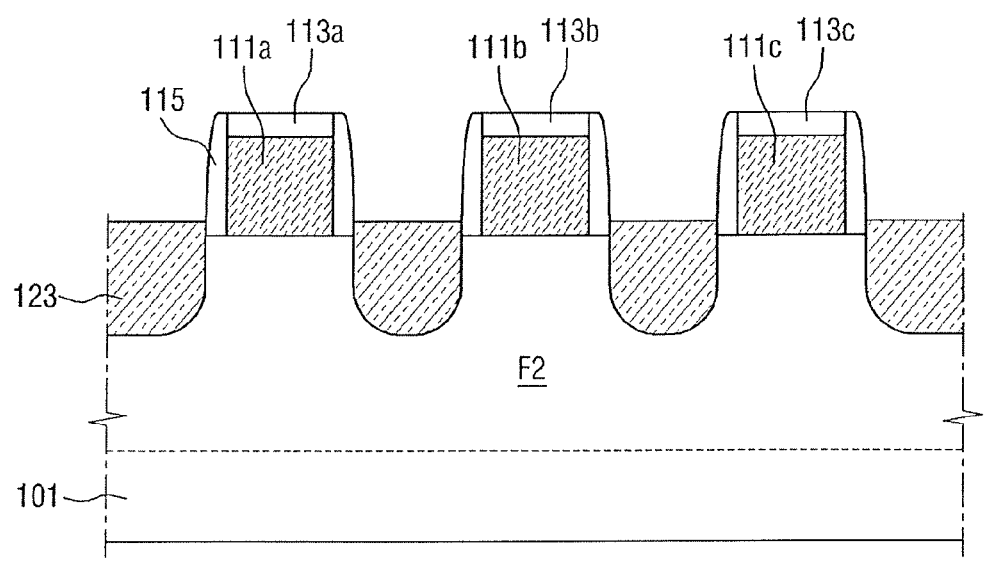

Referring to FIG. 9 and FIG. 10, the first, second and third source/drain regions 121, 123, 125 are formed on the etched parts of the first to third fins F1, F2, F3. The first source/drain region 121 may be formed in the first fin F1, the second source/drain region 123 may be formed in the second fin F2, and the third source/drain region 125 may be formed in the third fin F3. The first, second and third source/drain regions 121, 123, 125 may be elevated source/drain regions. Thus, the upper surfaces of the first, second and third source/drain regions 121, 123, 125 may be higher than the upper surfaces of the first to third fins F1, F2, F3.

When the semiconductor device according to one embodiment of the present inventive concept is a PMOS transistor, the first, second and third source/drain regions 121, 123, 125 may include a compressive stress material. For example, the compressive stress material may have a lattice constant greater than that of Si, and may be, for example, SiGe. The compressive stress material may apply compressive stress to the first to third fins F1, F2, F3 beneath the first and second gate structures 151a, 151b, that is, to a channel region, thereby improving carrier mobility in the channel region.

When the semiconductor device according to one embodiment of the present inventive concept is an NMOS transistor, the first, second and third source/drain regions 121, 123, 125 may include a tensile stress material. The first, second and third source/drain regions 121, 123, 125 may be formed of a material same as that of the substrate 101, or a tensile stress material. For example, when the substrate 101 is formed of Si, the first, second and third source/drain regions 121, 123, 125 may be formed of Si or a material having a lattice constant less than that of Si (for example, SiC and SiP).

The first, second and third source/drain regions 121, 123, 125 may be formed through an epitaxial growth process.

Although the first, second and third source/drain regions 121, 123, 125 are depicted as being in contact with each other in FIG. 9, the present disclosure is not limited thereto, and the first, second and third source/drain regions 121, 123, 125 may be spaced apart from each other.

Figure 11:
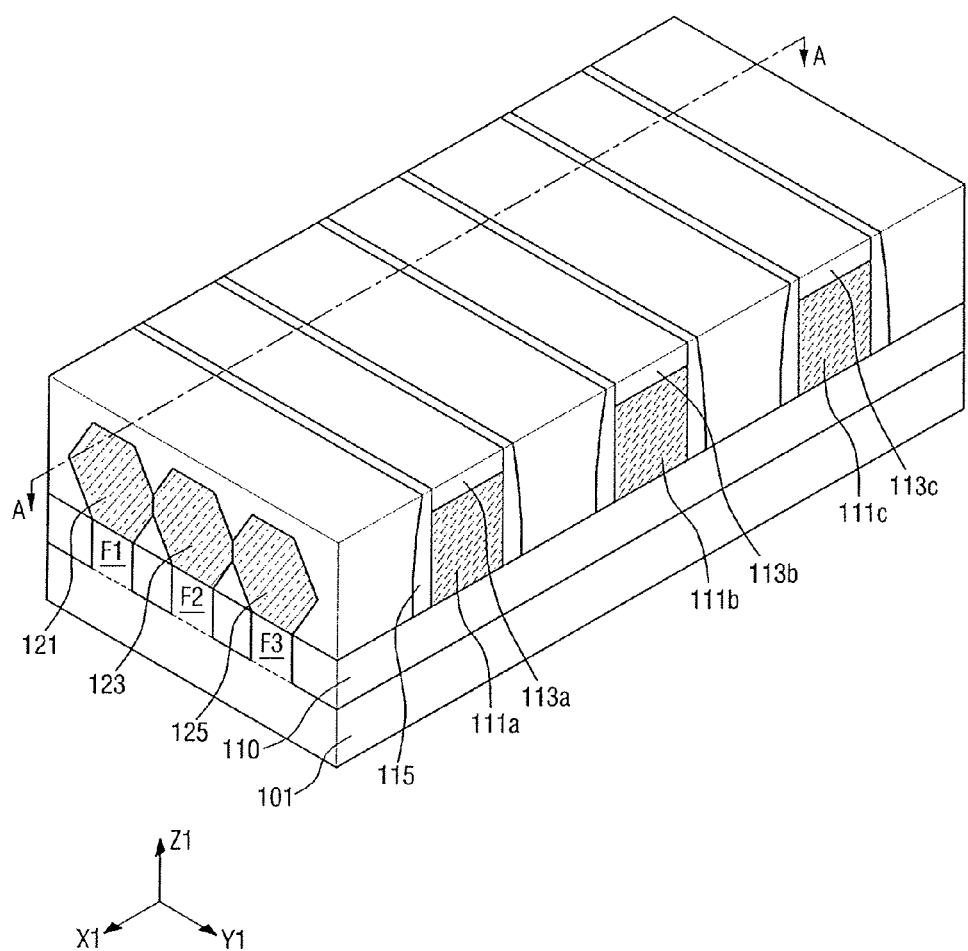
Figure 12:
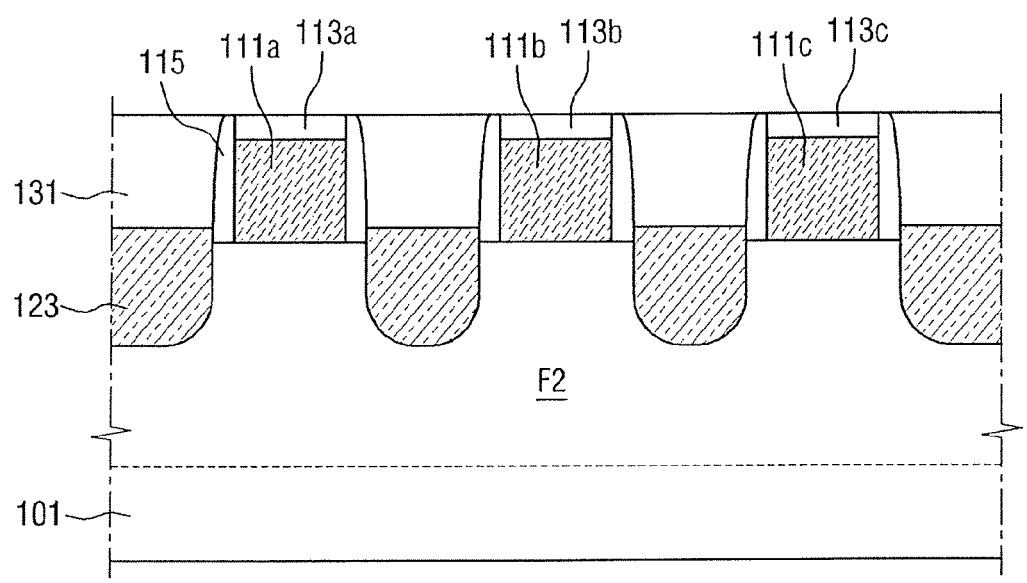

Referring to FIG. 11 and FIG. 12, the first interlayer insulation layer 131 is formed to cover the first, second and third source/drain regions 121, 123, 125. The first interlayer insulation layer 131 may cover the sidewall of the gate spacer 115 and expose upper surfaces of the first to third hard mask layers 113a, 113b, 113c. The first interlayer insulation layer 131 may include, for example, an oxide layer.

Figure 13:
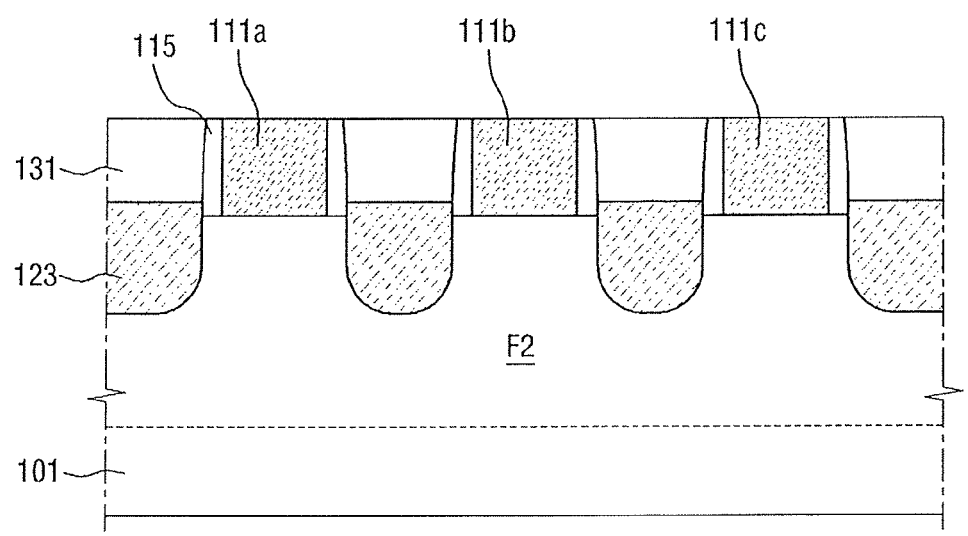

Referring to FIG. 13, the first to third hard mask layers 113a, 113b, 113c are removed. A planarization process (for example, a CMP process) may be performed to remove the first to third hard mask layers 113a, 113b, 113c, and the first interlayer insulation layer 131 may be partially etched during the planarization process.

After the planarization process, a cleaning process may be performed to remove residues or the like generated by the planarization process. In this case, the first interlayer insulation layer 131 may be partially removed to thus cause the upper surface of the first interlayer insulation layer 131 to be lower than the upper surfaces of the first to third sacrificial gate structures 111a, 111b, 111c. However, the present disclosure is not limited thereto, and referring to FIG. 14, the upper surface of the first interlayer insulation layer 131 may be disposed to be coplanar with the upper surfaces of the first to third sacrificial gate structures 111a, 111b, 111c.

Figure 14:
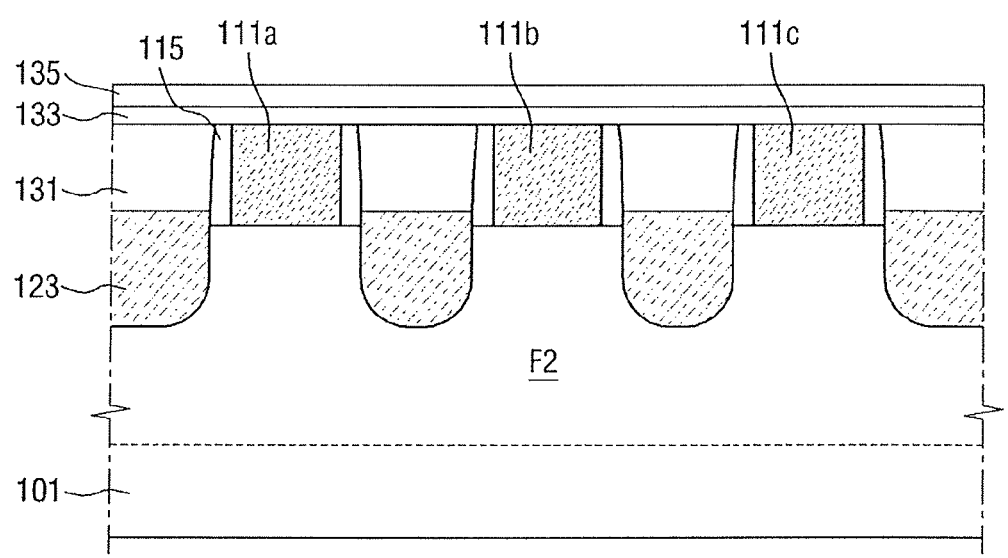

Referring to FIG. 14, a protective layer 133 is formed to cover the upper surface of the first interlayer insulation layer 131 and upper surfaces of the first to third sacrificial gate structures 111a, 111b, 111c. The protective layer 133 may prevent the first interlayer insulation layer 131 from being etched in the subsequent process. The protective layer 133 may include, for example, a nitride layer, an oxynitride layer and the like.

Furthermore, a buffer layer 135 is formed on the protective layer 133. The buffer layer 135 may compensate for the stepped portion which is formed during the formation of the protective layer 133. The buffer layer 135 may include a material same as that of the first interlayer insulation layer 131.

Figure 15:
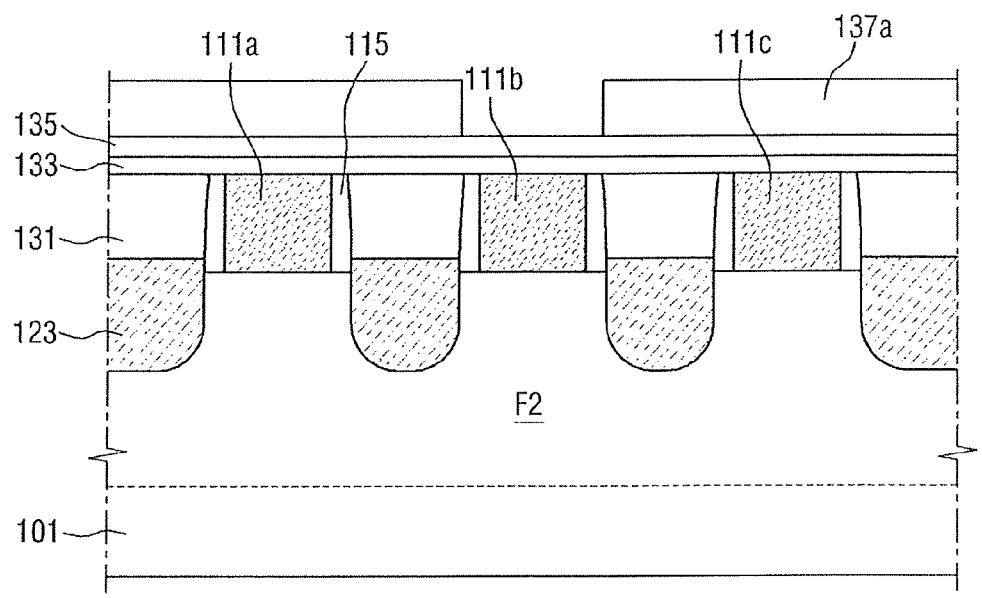

Referring to FIG. 15, an etching mask pattern 137a is formed on the protective layer 133. The etching mask pattern 137a may expose an upper portion of the second sacrificial gate structure 111b and cover the rest of the second sacrificial gate structure 111b.

Figure 16:
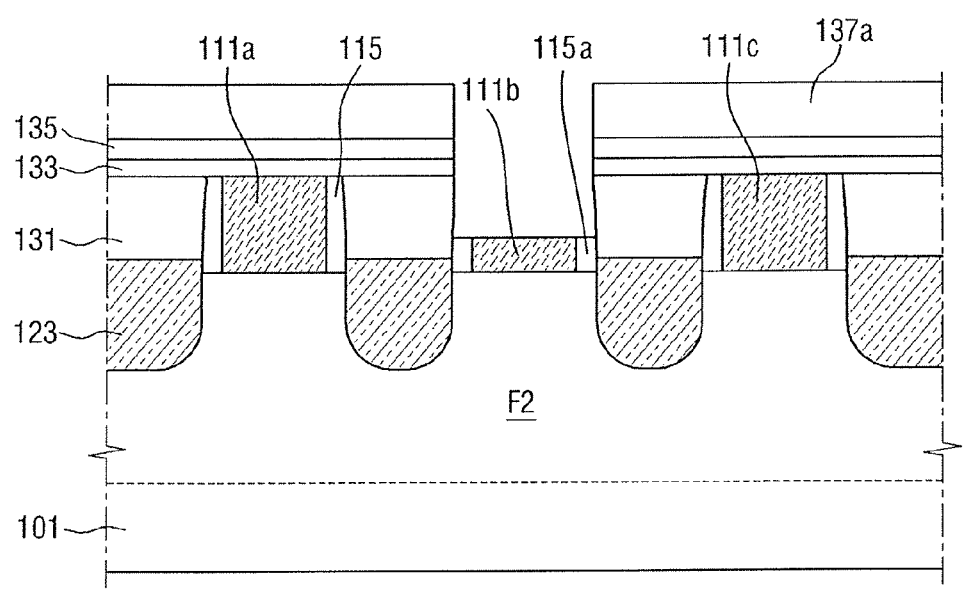

Referring to FIG. 16, a part of the second sacrificial gate structure 111b may be removed. Furthermore, a part of the gate spacer 115 adjacent to the second sacrificial gate structure 111b may be removed to form the spacer 115a.

The present embodiment is described as removing the part of the second sacrificial structure 111b, but the present disclosure is not limited thereto. Thus, the second sacrificial gate structure 111b may be removed in its entirety. The present embodiment is described as removing the part of the gate spacer 115 adjacent to the second sacrificial gate structure 111b, but the present disclosure is not limited thereto. Thus, the gate spacer 115 adjacent to the second sacrificial gate structure 111b may be removed or unremoved in its entirety.

The protective layer 133 on the second sacrificial gate structure 111b may be removed first by using the etching mask pattern 137a, and then the part of the second sacrificial gate structure 111b may be removed.

Figure 17:
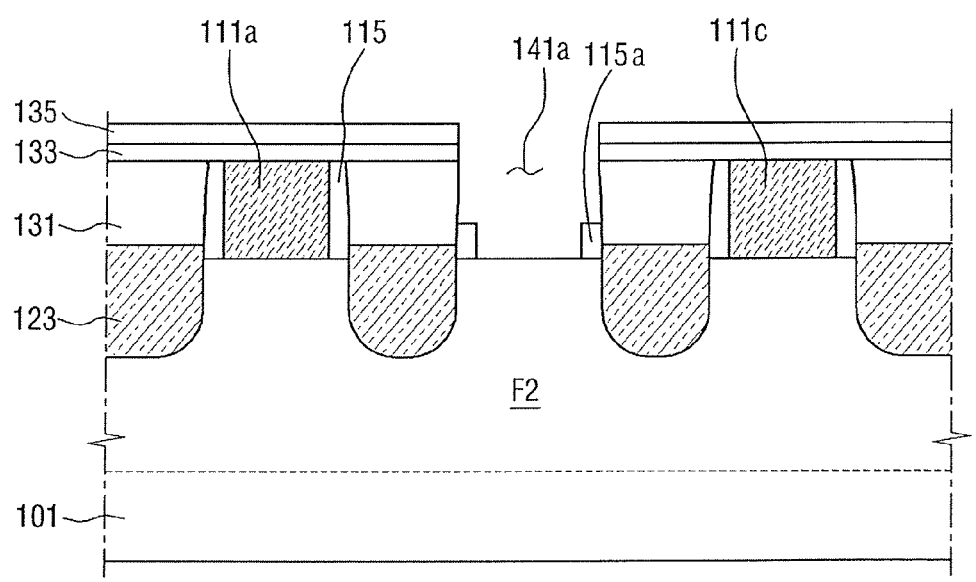

Referring now to FIG. 17, the rest of the second sacrificial gate structure 111b may be entirely removed, thereby forming the first recess 141a.

The first to third fins F1, F2, F3 may be exposed by the first recess 141a.

Figure 18:
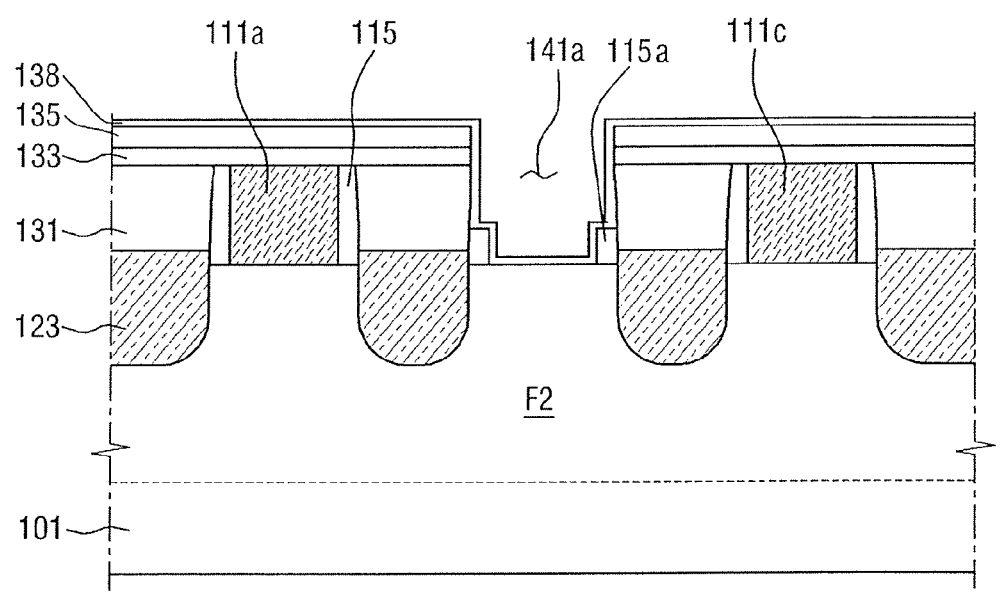

Referring to FIG. 18, a liner 138 may be formed. The liner 138 may be conformally formed along the upper surface and sidewall of the buffer layer 155, the upper surface and sidewall of the spacer 115a, and the upper surfaces of the first to third fins F1, F2, F3. The liner 138 may include at least one of an oxide layer, a nitride layer and an oxynitride layer.

Figure 19:
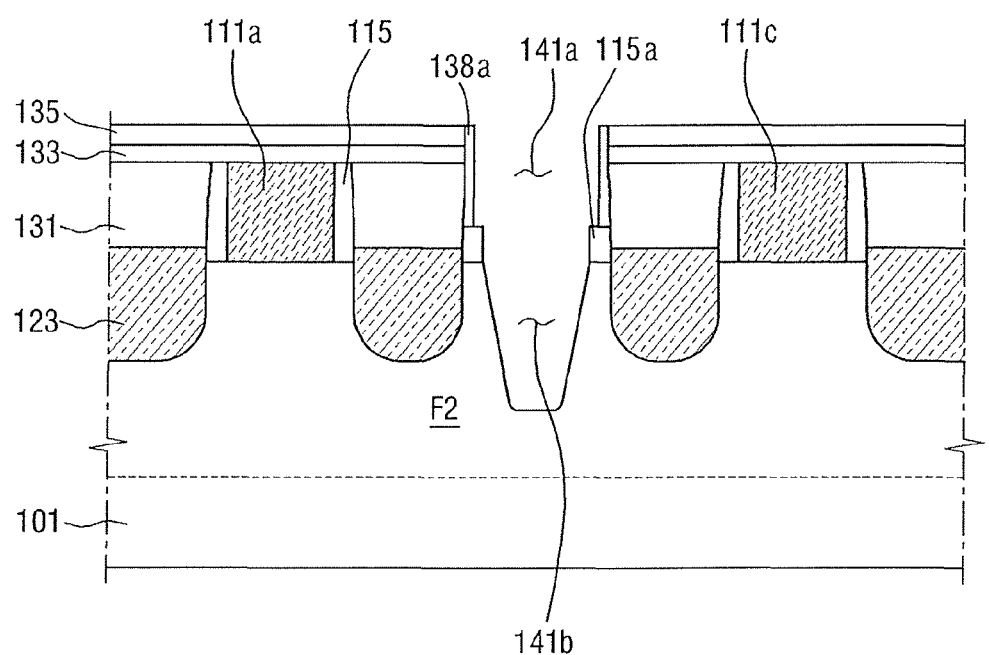

Referring to FIG. 19, the liner 138 is etched to expose the first to third fins F1, F2, F3 again. The liner 138a may remain at the sidewall of the first interlayer insulation layer 131 and the upper surface of the spacer 115 through, for example, an etch-back process and the like. The liner 138 may be disposed on the sidewall of the first recess 141a.

The exposed first to third fins F1, F2, F3 are etched to form the second recess 141b beneath the first recess 141a. Although not shown in the drawings, a part of the spacer 115 and a part of the liner 138 may also be etched during the formation of the second recess 141b. The lower surface of the second recess 141b may be lower than the lower surfaces of the first, second and third source/drain regions 121, 123, 125.

Although the second recess 141b is depicted in FIG. 19 as having a trench shape of which width becomes narrower in the direction from the top to the bottom thereof, the second recess 141b may have various shapes. This will be described herein below.

Figure 20:
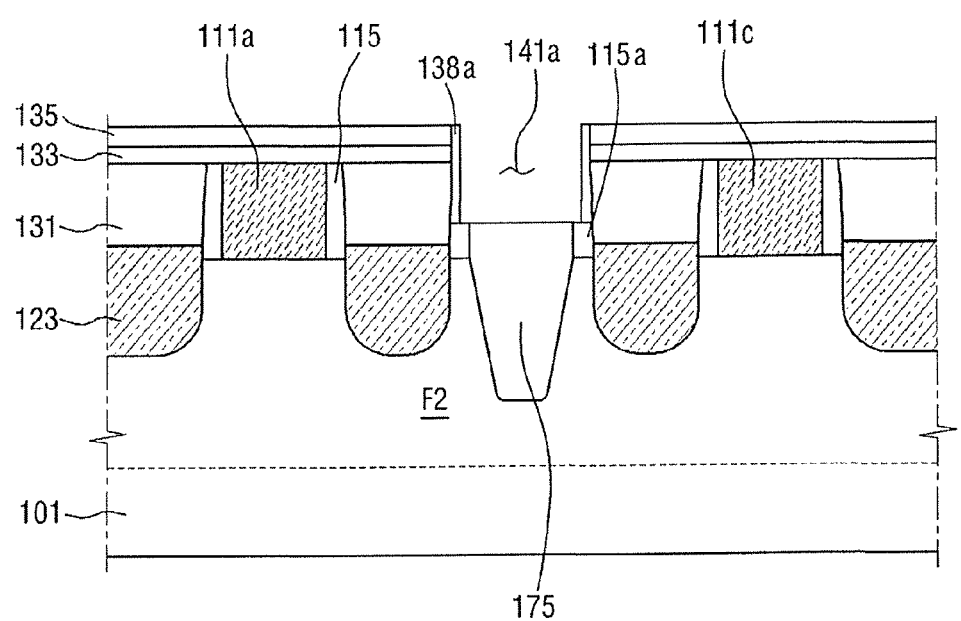

Referring to FIG. 20, the first device isolation layer 175 is formed to fill the second recess 141b. The first device isolation layer 175 may be, for example, an oxide layer, a nitride layer, an oxynitride layer and the like.

Figure 21:
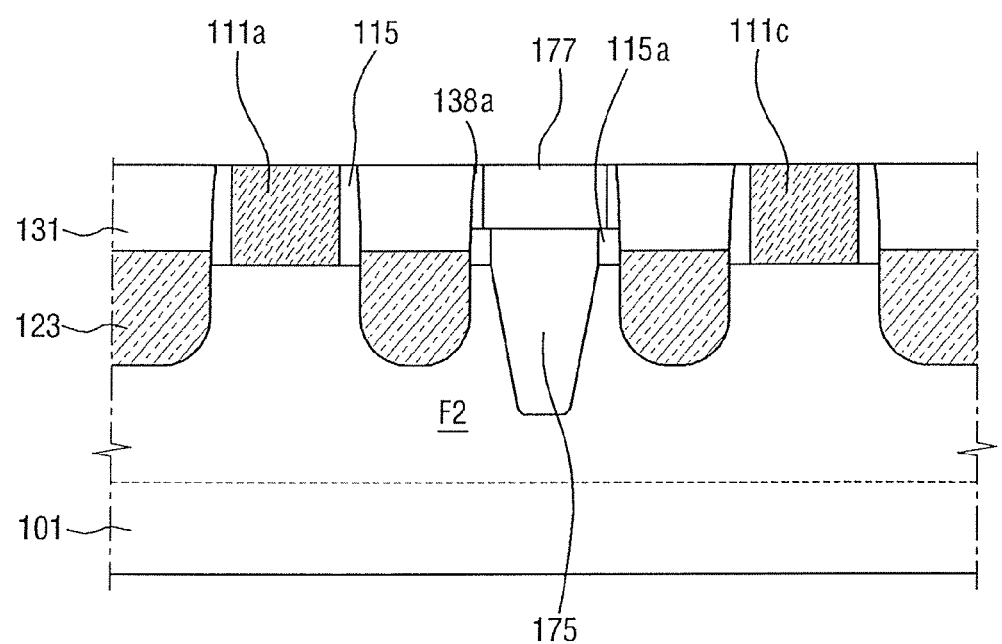

Referring to FIG. 21, the second device isolation layer 177 may be formed on the first device isolation layer 175. The first device isolation layer 175 may be, for example, tonensilazene (TOSZ) and the like. The lower surface of the second device isolation layer 177 may contact the upper surface of the spacer 115a, and the sidewall of the second device isolation layer 177 may also contact the liner 138a.

The protective layer 133 which covers the first and third sacrificial gate structures 111a and 111c, and the buffer layer 135 may be removed together through a planarization process and the like, when forming the second device isolation layer 177. The device isolation layers 175, 177 may remain only in the first recess 141a and the second recess 141b.

Referring back to FIG. 1 and FIG. 2, the first and third sacrificial gate structures 111a, 111c may be removed, and the first and second gate structures 151a, 151b may be formed in the portion where the first and third sacrificial gate structures 111a, 111c are removed.

Each of the first and second gate structures 151a, 151b may include the first and second gate insulation layers 153a, 153b and the first and second gate electrodes 155a, 155b.

Each of the first and second gate insulation layers 153a, 153b may be formed between the first to third fins F1, F2, F3 and the first and second gate electrodes 155a, 155b. Each of the first and second gate insulation layers 153a, 153b may be formed along the upper surfaces of the first to third fins F1, F2, F3 and the sidewall of the gate spacer 115. The first and second gate insulation layers 153a, 153b may include a high dielectric constant material having a dielectric constant higher than that of a silicon oxide layer. For example, the first and second gate insulation layers 153a, 153b may include $HfO_2$, $ZrO_2$, LaO, Al2O3 or $Ta_2O_5$ Each of the first and second gate electrodes 155a, 155b may include first and second metal layers MG1, MG2. As shown, each of the first and second gate electrodes 155a, 155b may be formed by stacking two or more layers of the first and second metal layers MG1, MG2. The first metal layer MG1 serves to adjust a work function, and the second metal layer MG2 serves to fill the space formed by the first metal layer MG1. The first metal layer MG1 may be formed along the upper surfaces of the first to third fins F1, F2, F3 and the sidewall of the gate spacer 115. For example, the first metal layer MG1 may include at least one of TiN, TaN, TiC, TiAlC and TaC. The second metal layer MG2 may include W or Al. In an example, the first and second gate electrodes 155a, 155b may be formed of a non-metal material such as Si, SiGe and the like.

Subsequently, the second interlayer insulation layer 132 is formed. The second interlayer insulation layer 132 may cover the first interlayer insulation layer 131, the first and second gate structures 151a, 151b, and the first and second device isolation layers 175, 177.

Then, the silicide layer 161 may be formed on the first, second and third source/drain regions 121, 123, 125, and the contact 163 may be formed on the silicide layer 161, thereby fabricating the semiconductor device according to one embodiment of the present inventive concept.

Figure 22:
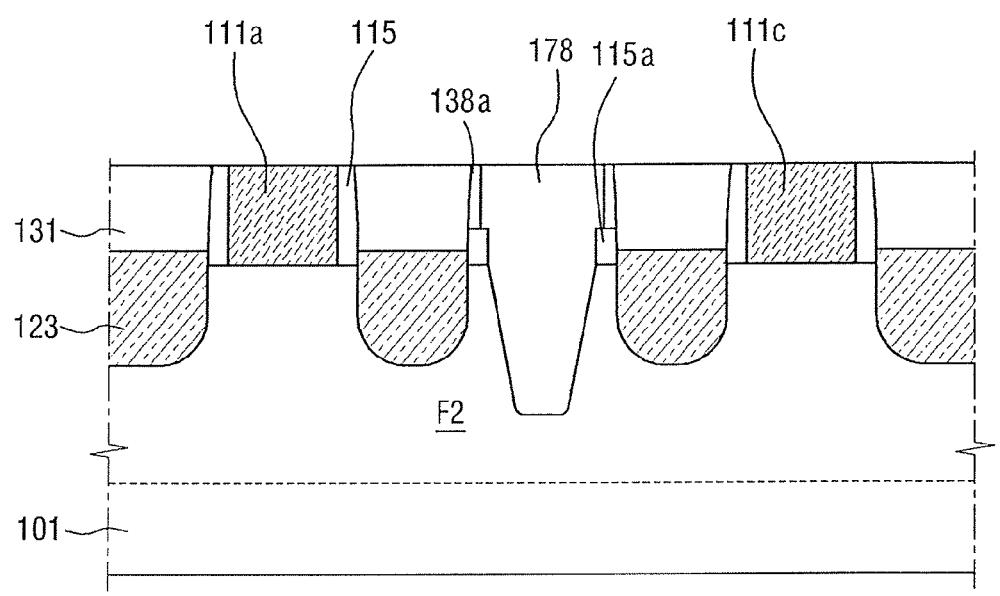
FIG. 22 is a diagram illustrating an intermediate process step of a method of fabricating the semiconductor device according to example embodiments of the present inventive concept.

FIG. 22 is a diagram illustrating an intermediate process step of a method of fabricating the semiconductor device according to another embodiment of the present inventive concept.

The diagram illustrating an intermediate process step of a method of fabricating the semiconductor device according to the present embodiment may correspond to FIG. 21 among the drawings illustrating intermediate process steps of a method of fabricating the semiconductor device according to one embodiment of the present inventive concept described above. The semiconductor device according to the present embodiment is substantially the same as the semiconductor device according to one embodiment of the present inventive concept described above except that a single third device isolation layer 178 is formed in the first recess 141a and the second recess 141b. Thus, the repetitive description of the same component will be omitted.

Referring to FIG. 22, the third device isolation layer 178 may be formed in the first recess 141a and the second recess 141b. The third device isolation layer 178 may include a material same as that of either the first device isolation layer 175 or the second device isolation layer 177 described above.

Figure 23:
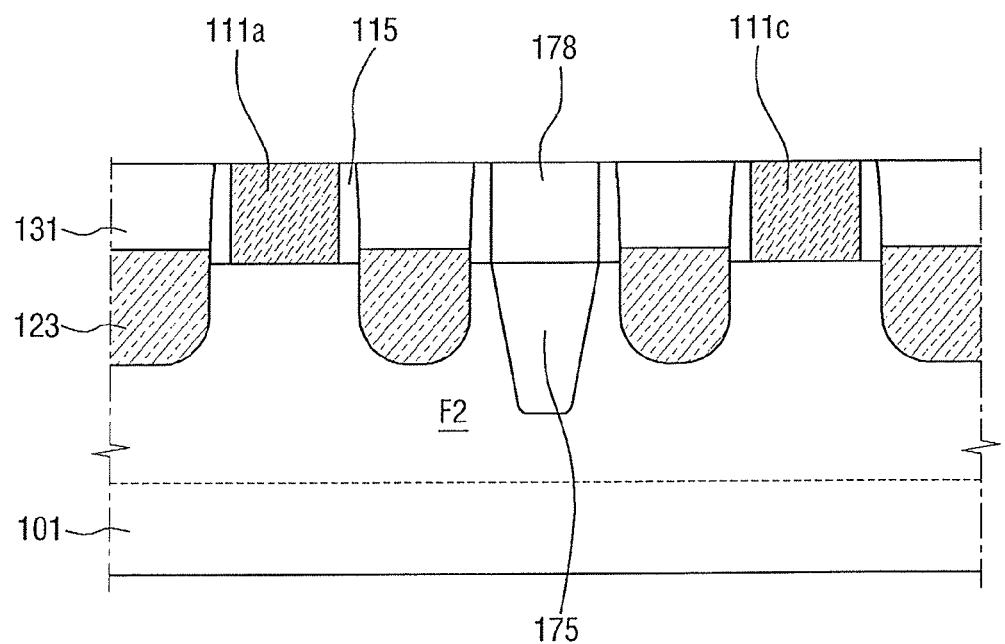
FIG. 23 is a diagram illustrating an intermediate process step of a method of fabricating the semiconductor device according to example embodiments of the present inventive concept.

FIG. 23 is a diagram illustrating an intermediate process step of a method of fabricating the semiconductor device according to another embodiment of the present inventive concept.

The diagram illustrating an intermediate process step of a method of fabricating the semiconductor device according to the present embodiment may correspond to FIG. 17 among the drawings illustrating intermediate process steps of a method of fabricating the semiconductor device according to one embodiment of the present inventive concept described above. The semiconductor device according to the present embodiment is substantially the same as the semiconductor device according to one embodiment of the present inventive concept described above except that a part of the gate spacer 115 in the first recess 141a may not be removed. Thus, the repetitive description of the same component will be omitted.

Referring to FIG. 23, the first device isolation layer 175 may be formed in the second recess 141b, and the third device isolation layer 178 may be formed in the first recess 141a. The gate spacer 115 may be disposed on the sidewall of the third device isolation layer 178. The upper surface of the third device isolation layer 178 and the upper surface of the gate spacer 115 may be disposed to be coplanar with each other. That is, the third device isolation layer 178 and the gate spacer 115 may have the same height.

Figure 24:
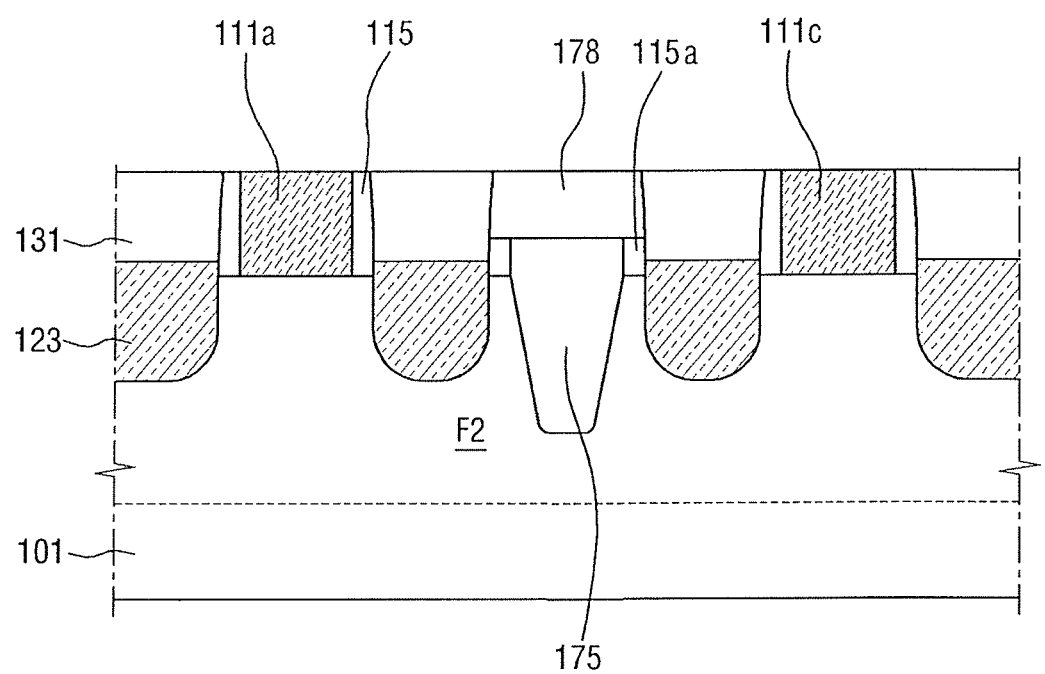
FIG. 24 is a diagram illustrating an intermediate process step of a method of fabricating the semiconductor device according to example embodiments of the present inventive concept.

FIG. 24 is a diagram illustrating an intermediate process step of a method of fabricating the semiconductor device according to some embodiments of the present inventive concept.

The diagram illustrating an intermediate process step of a method of fabricating the semiconductor device according to the present embodiment may correspond to FIG. 21 among the drawings illustrating intermediate process steps of a method of fabricating the semiconductor device according to some embodiments of the present inventive concept described above. The semiconductor device according to the present embodiment is substantially the same as the semiconductor device according to some embodiments of the present inventive concept described above except that the liner 138a in the first recess 141a may be removed. Thus, the repetitive description of the same component will be omitted.

Referring to FIG. 24, the liner 138a may not be disposed in the first recess 141a. Thus, the sidewall of the third device isolation layer 178 disposed in the first recess 141a may directly contact the first interlayer insulation layer 131.

FIG. 25 to FIG. 30 are diagrams illustrating various shapes of the second recess included in the semiconductor devices according to embodiments of the present inventive concept.

Figure 25:
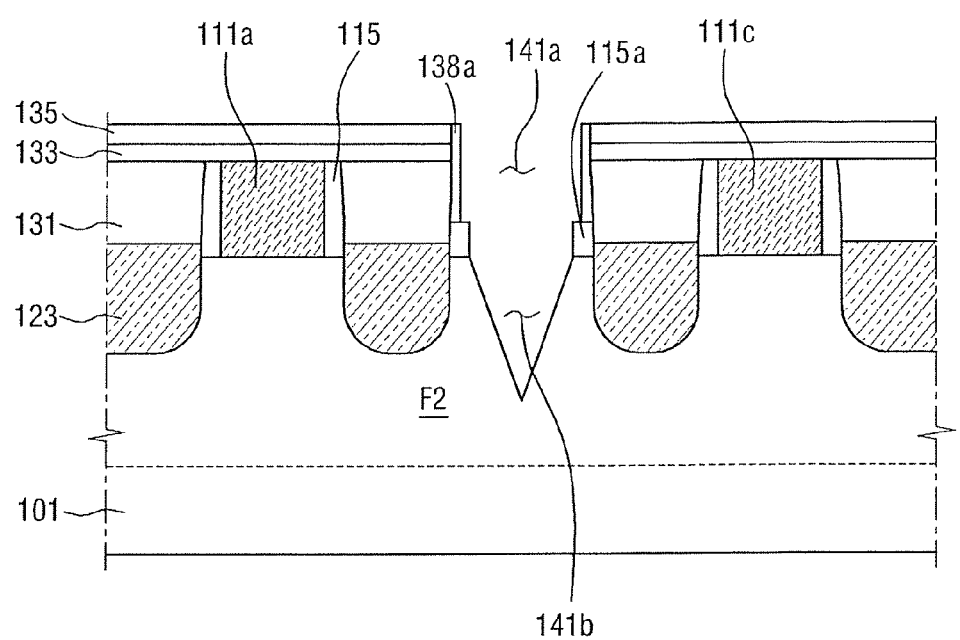
FIGS. 25, 26, 27, 28, 29 and 30 are diagrams illustrating various shapes of the second recess included in the semiconductor devices according to example embodiments of the present inventive concept.
Figure 26:
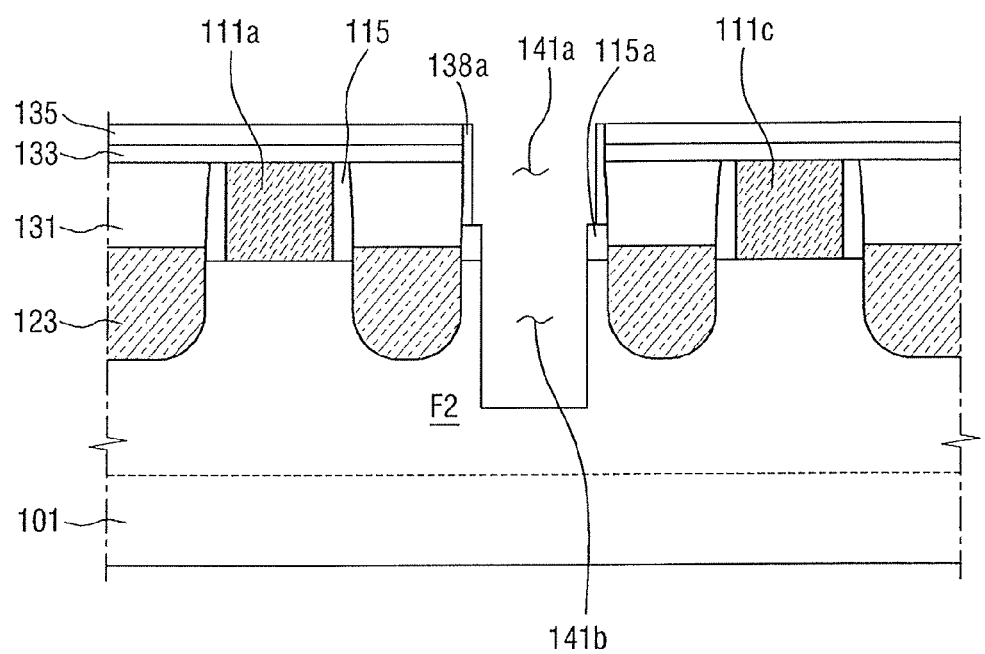
Figure 27:
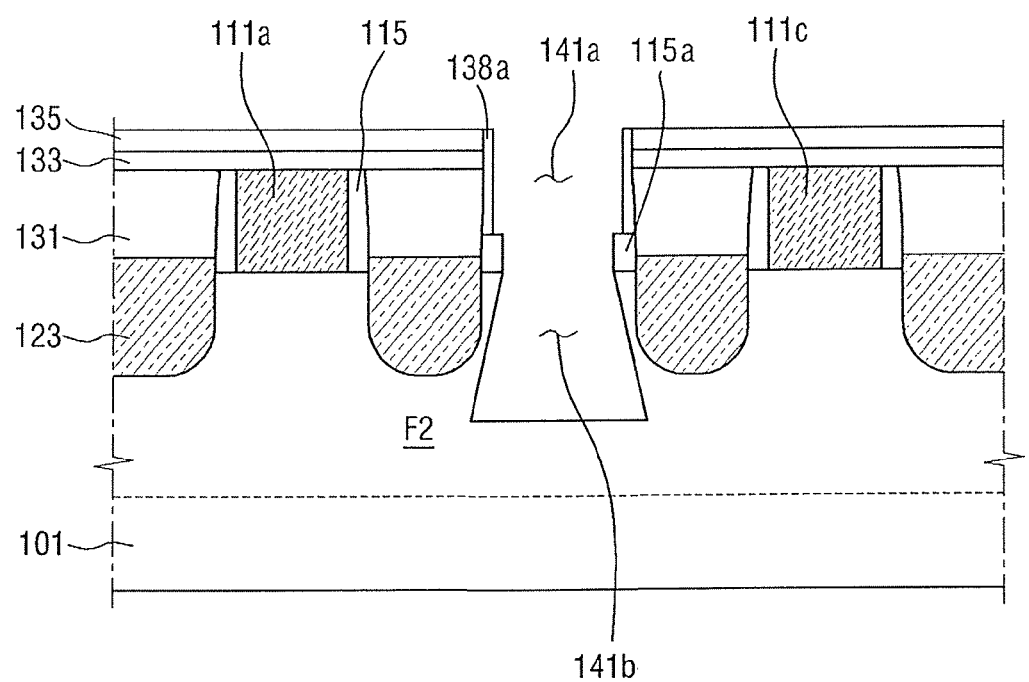
Figure 29:
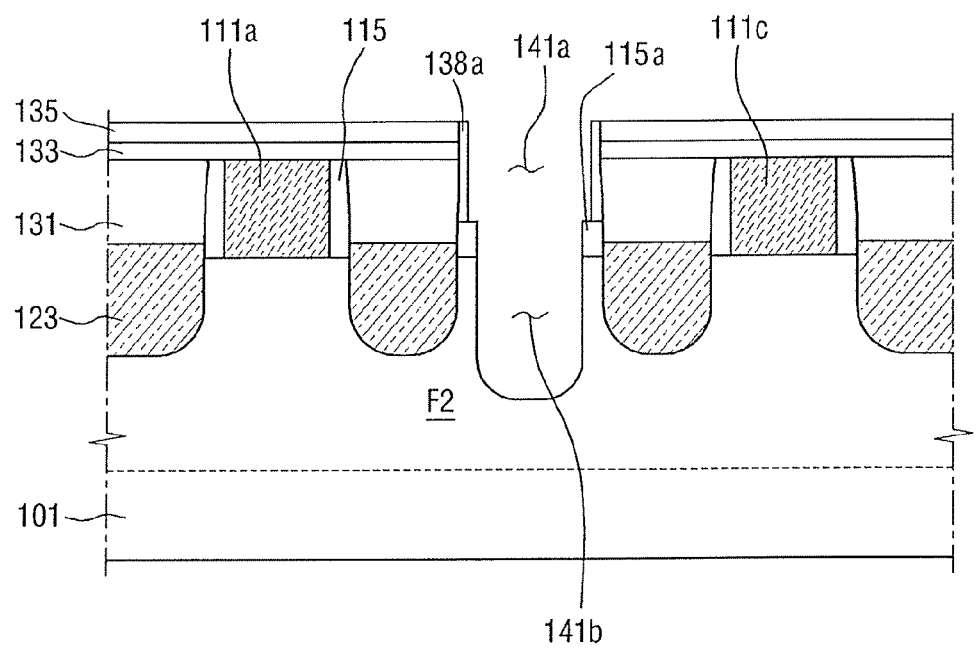
Figure 30:
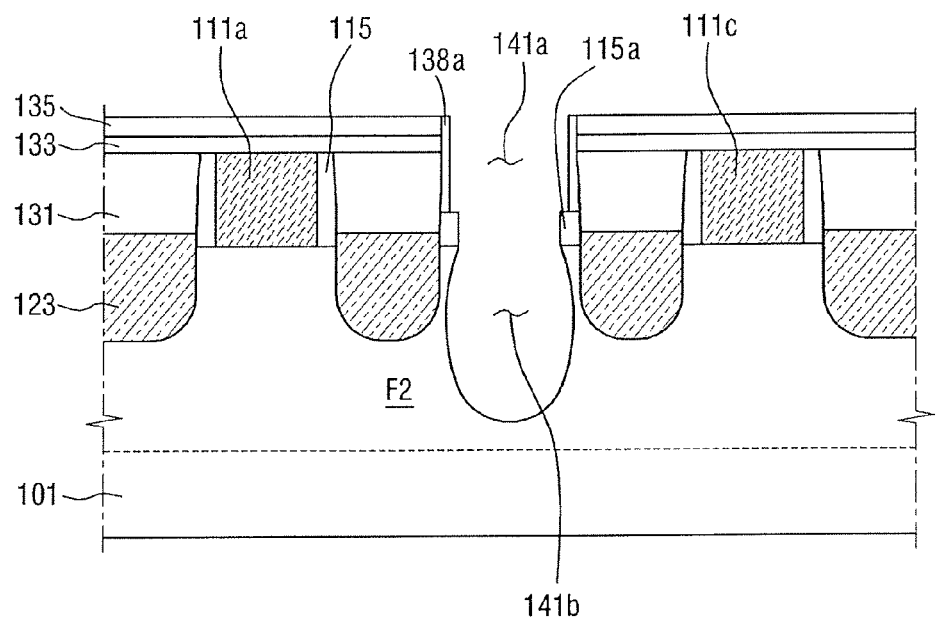

The second recess 141b may have a V-shape as shown in FIG. 25, a rectangular shape as shown in FIG. 26, a trapezoidal shape as shown in FIG. 27, an angled U-shape as shown in FIG. 28, a U-shape as shown in FIG. 29, and an elliptical shape as shown in FIG. 30. However, the present disclosure is not limited thereto.

Figure 31A:
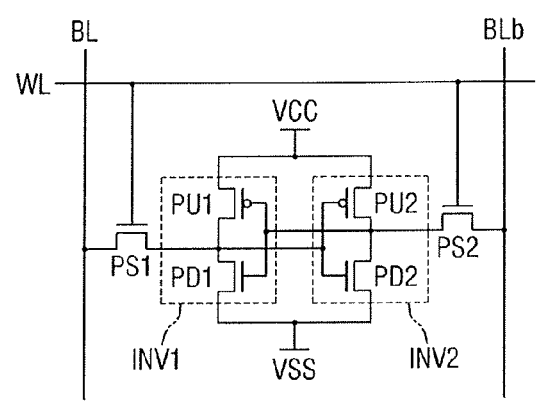
FIG. 31A is a circuit diagram illustrating the semiconductor device according to example embodiments of the present inventive concept.
Figure 31B:
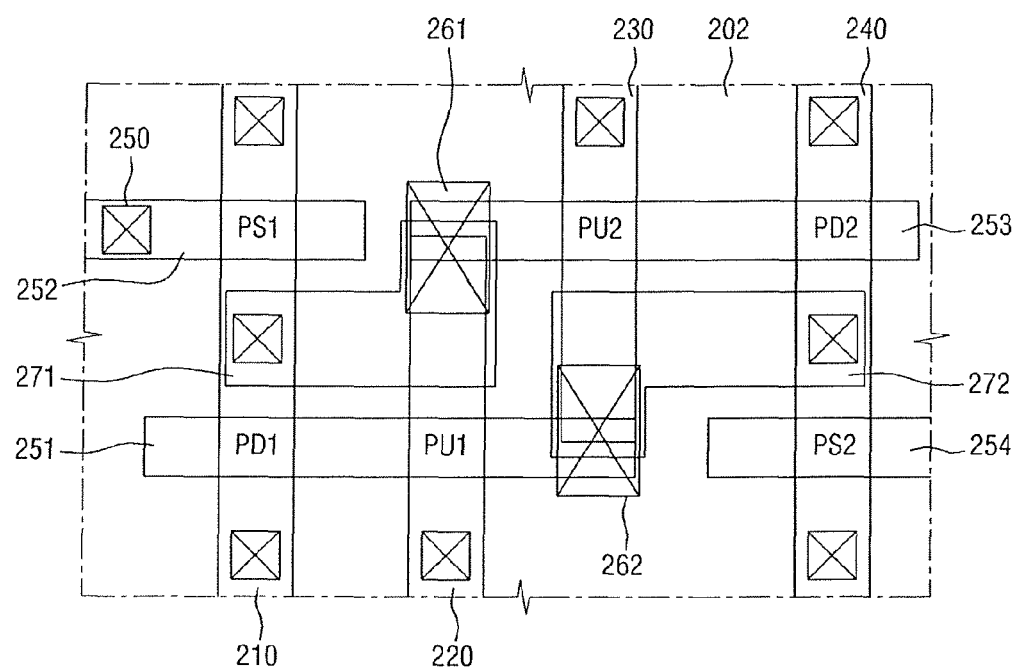
FIG. 31B is a layout diagram of the semiconductor device shown in FIG. 31A.

FIG. 31A is a circuit diagram illustrating the semiconductor device according to some embodiments of the present inventive concept. FIG. 31B is a layout diagram of the semiconductor device shown in FIG. 31A.

Hereinafter, repetitive descriptions of the same components as those of the embodiments described above will be omitted and differences from the embodiments described above will be mainly explained.

Referring first to FIG. 31A, the semiconductor device may include a pair of inverters INV1, INV2 connected in parallel between a power node VCC and a ground node VSS, and a first pass transistor PS1 and a second pass transistor PS2 connected to the respective output nodes of the inverters INV1, INV2. The first pass transistor PS1 and the second pass transistor PS2 may be connected respectively to a bitline BL and a complementary bitline BLb. Gates of the first pass transistor PS1 and the second pass transistor PS2 may be connected to a wordline WL.

The first inverter INV1 may include a first pullup transistor PU1 and a first pulldown transistor PD1 connected in series, and the second inverter INV2 may include a second pullup transistor PU2 and a second pulldown transistor PD2 connected in series. The first pullup transistor PU1 and the second pullup transistor PU2 may be a PFET transistor, and the first pulldown transistor PD1 and the second pulldown transistor PD2 may be an NFET transistor.

Furthermore, an input node of the first inverter INV1 is connected to the output node of the second inverter INV2, and an input node of the second inverter INV2 is connected to the output node of the first inverter INV1 so as to constitute a single latch circuit.

Referring to FIG. 31A and FIG. 31B, a first active fin 210, a second active fin 220, a third active fin 230 and a fourth active fin 240 spaced apart from each other may extend long in one direction. In this case, the second active fin 220 and the third active fin 230 may extend shorter than the first active fin 210 and the fourth active fin 240.

Furthermore, a first gate electrode 251, a second gate electrode 252, a third gate electrode 253 and a fourth gate electrode 254 may extend long in the other direction, and the first gate electrode 251 to the fourth gate electrode 254 may intersect the first active fin 210 to the fourth active fin 240.

Specifically, the first gate electrode 251 may completely intersect the first active fin 210 and the second active fin 220, and may be partially overlapped with a distal end of the third active fin 230. The third gate electrode 253 may completely intersect the fourth active fin 240 and the third active fin 230, and may be partially overlapped with a distal end of the second active fin 220. Each of the second gate electrode 252 and the fourth gate electrode 254 may intersect the first active fin 210 and the fourth active fin 240, respectively.

As shown, the first pullup transistor PU1 may be defined around the area in which the first gate electrode 251 and the second active fin 220 intersect with each other, the first pulldown transistor PD1 may be defined around the area in which the first gate electrode 251 and the first active fin 210 intersect with each other, and the first pass transistor PS1 may be defined around the area in which the second gate electrode 252 and the first active fin 210 intersect with each other. The second pull-up transistor PU2 may be defined around the area in which the third gate electrode 253 and the third active fin 230 intersect with each other, the second pulldown transistor PD2 may be defined around the area in which the third gate electrode 253 and the fourth active fin 240 intersect with each other, and the second pass transistor PS2 may be defined around the area in which the fourth gate electrode 254 and the fourth active fin 240 intersect with each other.

A source/drain may be formed at both sides of the area in which the first to fourth gate electrodes 251, 252, 253, 254 and the first to fourth active fins 210 to 240 intersect with each other, and a plurality of contacts 250 may be formed.

Furthermore, a first shared contact 261 may connect the second active fin 220, the third gate line 253 and wiring 271 together, and a second shared contact 262 may connect the third active fin 230, the first gate line 251 and wiring 272 together.

At least one of the semiconductor devices according to the embodiments of the present inventive concept described above may be applied to the semiconductor device shown herein.

For example, at least one of the semiconductor devices according to the embodiments of the present inventive concept described above may be employed as a configuration for separating the first pass transistor PS1 and the first pull-down transistor PD1 or for separating the second pass transistor PS2 and the second pull-down transistor PD2.

Furthermore, the semiconductor devices according to the embodiments of the present inventive concept described above may be employed as a configuration for forming the first and second pull-up transistors PU1, PU2 and the first and second pull-down transistors PD1, PD2.

Figure 32:
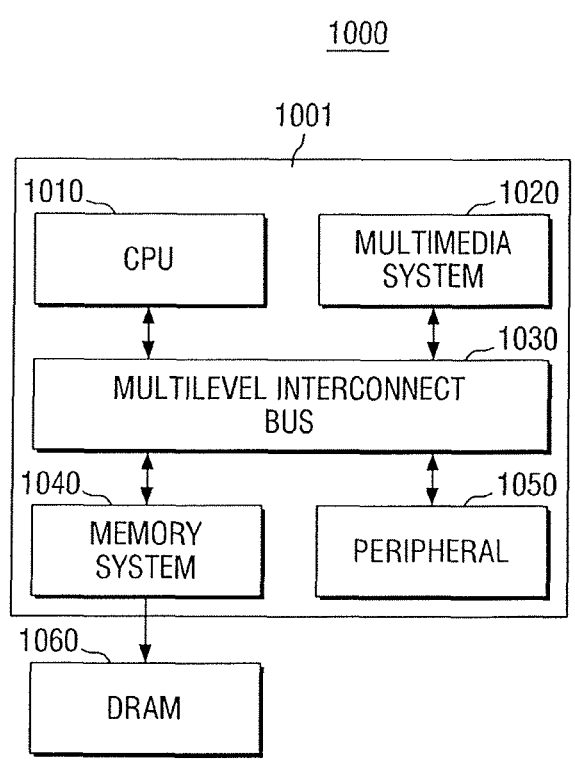
FIG. 32 is a block diagram of an SoC system including the semiconductor devices according to the example embodiments of the present inventive concept.

FIG. 32 is a block diagram of an SoC system including the semiconductor devices according to the embodiments of the present inventive concept.

Referring to FIG. 32, a SoC system 1000 may include an application processor 1001 and DRAM 1060.

The application processor 1001 may include a central processing unit 1010, a multimedia system 1020, a memory system 1040 and a peripheral circuit 1050.

The central processing unit 1010 may perform an arithmetic operation required for driving the SoC system 1000. In some embodiments of the present inventive concept, the central processing unit 1010 may be configured into a multicore environment including a plurality of cores.

The multimedia system 1020 may be used in carrying out various multimedia functions in the SoC system 1000. The multimedia system 1020 may include a 3D engine module, a video codec, a display system, a camera system, a post-processor and the like.

The bus 1030 may be used in data communication among the central processing unit, the multimedia system 1020, the memory system 1040 and the peripheral circuit 1050. In some embodiments of the present inventive concept, the bus 1030 may have a multi-layer structure. Specifically, a multi-layer advanced high-performance bus (AHB) or a multi-layer advanced extensible interface (AXI) may be used as the bus 1030, but the present disclosure is not limited thereto.

The memory system 1040 may provide an environment required to enable the application processor 1001 to be connected to an external memory (for example, DRAM 1060) and to operate at high speed. In some embodiments of the present inventive concept, the memory system 1040 may include a separate controller (for example, a DRAM controller) for controlling an external memory (for example, DRAM 1060).

The peripheral circuit 1050 may provide an environment required to enable the SoC system 1000 to be smoothly connected to an external device (for example, a main board). Thus, the peripheral circuit 1050 may include various interfaces for compatibility of the external device connected to the SoC system 1000.

DRAM 1060 may function as an operation memory required for operating the application processor 1001. In some embodiments of the present inventive concept, DRAM 1060 may be disposed outside the application processor 1001 as shown. Specifically, DRAM 1060 may be packaged with the application processor 1001 into package on package (PoP).

At least one of the components of the SoC system 1000 may include the semiconductor devices according to the embodiments of the present inventive concept described above.

Figure 33:
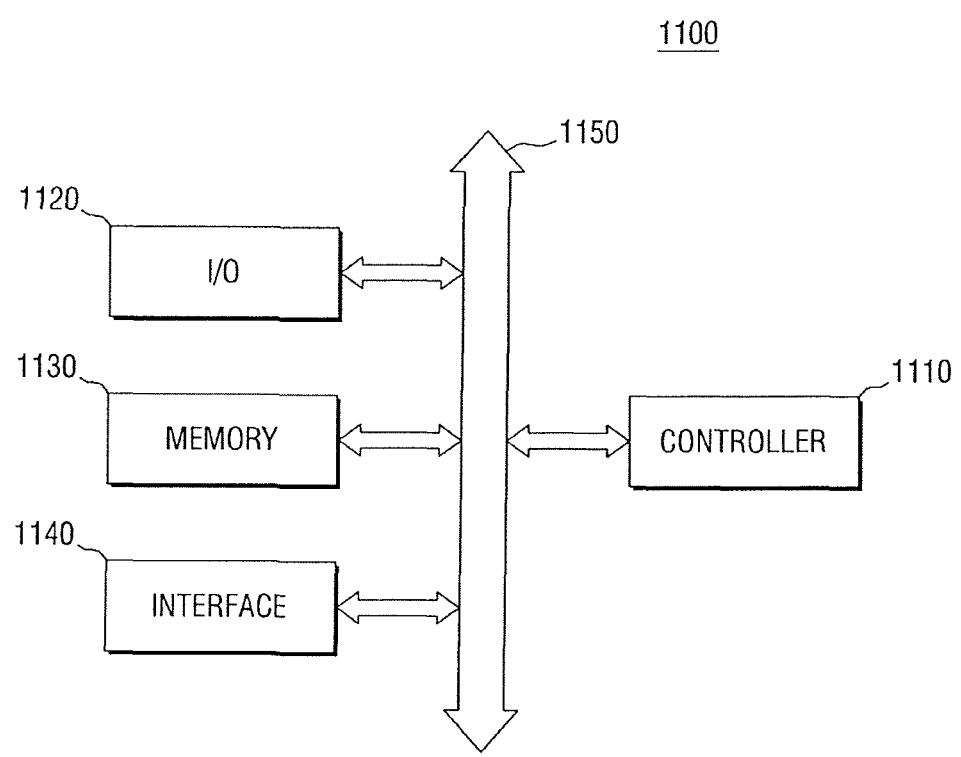
FIG. 33 is a block diagram illustrating an electronic system including semiconductor devices according to the example embodiments of the present inventive concept.

FIG. 33 is a block diagram illustrating an electronic system including semiconductor devices according to the embodiments of the present inventive concept.

Referring to FIG. 33, an electronic system 1100 according to the embodiment of the present inventive concept may include a controller 1110, an input/output (I/O) device 1120, a memory device 1130, an interface 1140 and a bus 1150. The controller 1110, the input/output (I/O) device 1120, the memory device 1130 and/or the interface 1140 may be coupled with each other through the bus 1150. The bus 1150 may serve as a path for data movement.

The controller 1110 may include at least one of a microprocessor, a digital signal processor, a microcontroller, and logic elements capable of performing functions similar to those of the microprocessor, the digital signal processor, and the microcontroller. The input/output device 1120 may include a keypad, a keyboard, a display device and the like. The memory device 1130 may store therein data and/or instructions and the like. The interface 1140 may perform the function of transmitting data to a communication network or receiving data from the communication network. The interface 1140 may be of a wired or wireless type. For example, the interface 1140 may include an antenna, a wired/wireless transceiver or the like.

Although not shown, the electronic system 1100 may further include high speed DRAM and/or SRAM as an operation memory for improving an operation of the controller 1110. In this case, the above-described semiconductor devices according to the embodiments of the present inventive concept may be employed as the operation memory. The above-described semiconductor devices according to the embodiments of the present inventive concept may be provided within the memory device 1130, or provided as a part of the controller 1110, the input/output device 1120 and the like.

The electronic system 1100 can be applied to a personal digital assistant (PDA), a portable computer, a web tablet, a wireless phone, a mobile phone, a digital music player, a memory card, or all electronic products that can transmit and/or receive information in a wireless environment.

Figure 34:
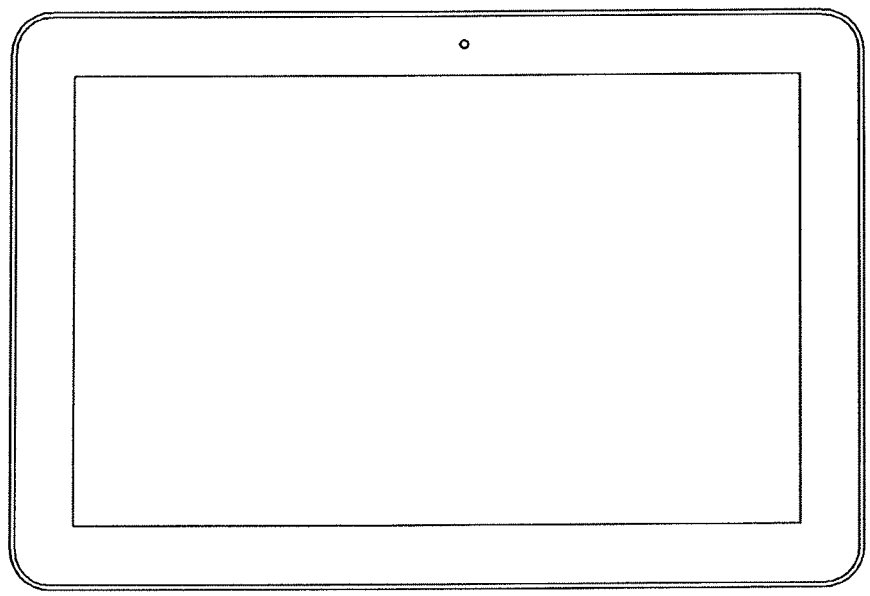
FIGS. 34, 35 and 36 are diagrams illustrating examples of semiconductor systems to which semiconductor devices according to example embodiments of the present inventive concept can be applied.
Figure 35:
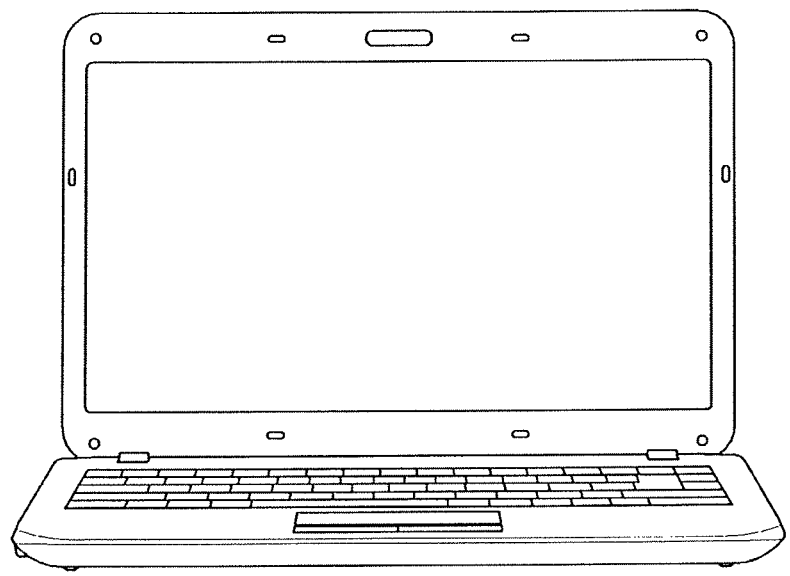
Figure 36:
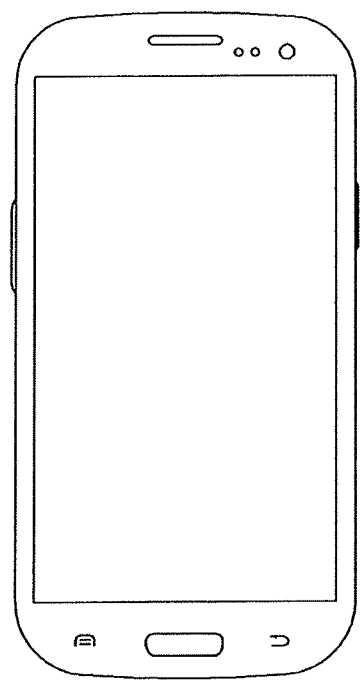

FIG. 34 to FIG. 36 are diagrams illustrating examples of semiconductor systems to which semiconductor devices according to some embodiments of the present inventive concept can be applied.

FIG. 34 illustrates a tablet PC 1200, FIG. 35 illustrates a notebook 1300, and FIG. 36 illustrates a smart phone 1400. At least one of the above-described semiconductor devices according to the embodiments of the present inventive concept can be used in the tablet PC 1200, the notebook 1300, the smart phone 1400 and the like.

It would be obvious to a person skilled in the art that the semiconductor devices fabricated by a method of fabricating semiconductor devices according to some embodiments of the present inventive concept may be applied to other integrated circuit devices which are not illustrated herein. That is, although only the tablet PC 1200, the notebook 1300 and the smart phone 1400 are described above as examples of the semiconductor system according to the embodiment of the present inventive concept, examples of the semiconductor system according to the embodiment of the present inventive concept are not limited thereto. In some embodiments of the present inventive concept, the semiconductor system may be implemented as a computer, an ultra mobile PC (UMPC), a workstation, a net book, a personal digital assistant (PDA), a portable computer, a wireless phone, a mobile phone, an e-book, a portable multimedia player (PMP), a portable gaming console, a navigation device, a black box, a digital camera, a 3-dimensional television, a digital audio recorder, a digital audio player, a digital picture recorder, a digital picture player, a digital video recorder, a digital video player and the like.

Although the embodiments of the present inventive concept have been described with reference to the attached drawings, the present inventive concept is not limited to the above-described embodiments and may be made into various modifications different from each other. It is to be understood by those skilled in the art that various alternations can be made without changing the technical idea or features of the present inventive concept. Therefore, it is to be understood that the embodiments described thus far are merely illustrative in all aspects and not to be interpreted as limiting.

What is claimed is:

1. A semiconductor device comprising:
   a fin protruding from a substrate and extending in a first direction;
   first and second gate structures intersecting the fin;
   a recess in the fin between the first and second gate structures, wherein the recess is filled with a device isolation layer, and wherein the
   device isolation layer has an upper surface protruding from the fin;
   a liner along a side wall of the device isolation layer protruding from the fin; and
   a source/drain region disposed at opposite sides of the recess and spaced apart from the device isolation layer,
   wherein the device isolation layer includes a first device isolation layer filling the recess and a second device isolation layer on the first device isolation layer, having a width different from a width of the first device isolation layer.

2. The semiconductor device of claim 1, wherein the first device isolation layer and the second device isolation layer are formed of materials different from each other.

3. The semiconductor device of claim 1, further comprising a spacer formed between the second device isolation layer and the fin, and contacting a sidewall of the first device isolation layer.

4. The semiconductor device of claim 1, wherein a lower surface of the recess is lower than a lower surface of the source/drain region.

5. A semiconductor device comprising:
   a fin protruding from a substrate, and extending in a first direction;
   a recess in the fin;
   a first device isolation layer disposed in the recess;
   a second device isolation layer formed on the first device isolation layer;
   a source/drain region disposed at opposite sides of the recess and spaced apart from the first device isolation layer; and
   a spacer along a sidewall of an upper portion of the first device isolation layer,
   wherein the first device isolation layer and the second device isolation layer are formed of materials different from each other, and
   wherein an upper portion of the first device isolation layer protrudes from the fin.

6. The semiconductor device of claim 5, wherein an upper surface of the first device isolation layer is in direct contact with a lower surface of the second device isolation layer.

7. The semiconductor device of claim 5, wherein an upper surface of the spacer and an upper surface of the first device isolation layer are coplanar with each other.

8. The semiconductor device of claim 5, wherein the first device isolation layer contacts the substrate at a bottom of the recess.

9. The semiconductor device of claim 5, wherein the first device isolation layer fills the recess.

10. The semiconductor device of claim 5, wherein the spacer is interposed between the source/drain region and the first device isolation layer.

11. A semiconductor device comprising:
    a fin protruding from a substrate and extending in a first direction;
    first and second gate structures intersecting the fin;
    a first recess in the fin between the first and second gate structures;
    a first device isolation layer disposed in the first recess;
    a source/drain region disposed at opposite sides of the first recess and spaced apart from the first device isolation layer;
    a spacer along a side wall of an upper portion of the first device isolation layer,
    wherein an upper surface of the first device isolation layer and an upper surface of the spacer are lower than an upper surface of the first gate structure; and
    wherein the upper surface of the first device isolation layer is positioned above an upper surface of the fin.

12. The semiconductor device of claim 11, wherein the first device isolation layer contacts the substrate at a bottom of the first recess.

13. The semiconductor device of claim 11, wherein the first recess is disposed adjacent to the substrate.

14. The semiconductor device of claim 11, wherein the spacer is interposed between the source/drain region and the first device isolation layer.

15. The semiconductor device of claim 11, wherein an upper surface of the spacer and the upper surface of the first device isolation layer are coplanar with each other.

16. The semiconductor device of claim 11, wherein the upper surface of the first device isolation layer is positioned above a lowermost surface of the first gate structure along a direction orthogonal to the upper surface of the substrate.

17. The semiconductor device of claim 11, wherein the first device isolation layer fills the first recess.

18. The semiconductor device of claim 11, further comprising a gate spacer on a sidewall of the first gate structure, wherein the spacer includes the same material as the gate spacer.

19. The semiconductor device of claim 11, further comprising a second recess on the first recess, wherein the spacer comprises a step formed by a difference between a width of the first recess and a width of the second recess above the upper surface of the fin.

* * * * *